(12) United States Patent
Andre et al.

(10) Patent No.: US 10,299,393 B2
(45) Date of Patent: *May 21, 2019

(54) THREE-DIMENSIONAL STRUCTURES AND RELATED METHODS OF FORMING THREE-DIMENSIONAL STRUCTURES

(71) Applicant: Apple Inc., Cupertino, CA (US)

(72) Inventors: Bartley K. Andre, Menlo Park, CA (US); Matthew Dean Rohrbach, San Francisco, CA (US); Peter N. Russell-Clarke, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/163,129

(22) Filed: Oct. 17, 2018

(65) Prior Publication Data

US 2019/0053389 A1    Feb. 14, 2019

Related U.S. Application Data

(60) Continuation of application No. 15/017,545, filed on Feb. 5, 2016, now Pat. No. 10,117,343, which is a
(Continued)

(51) Int. Cl.
*H05K 5/02* (2006.01)
*B23P 13/00* (2006.01)
(Continued)

(52) U.S. Cl.
CPC ................ *H05K 5/02* (2013.01); *B05D 3/06* (2013.01); *B05D 3/10* (2013.01); *B05D 3/12* (2013.01); *B23K 26/361* (2015.10); *B23K 26/362* (2013.01); *B23K 26/38* (2013.01); *B23K 26/382* (2015.10); *B23K 26/402* (2013.01); *B23P 13/00* (2013.01); *B29C 67/00* (2013.01);
(Continued)

(58) Field of Classification Search
CPC .......... H05K 5/02; H05K 5/03; B23K 26/361; B23K 26/362; B23K 26/38; B23K 2103/50; B44C 1/228; B44C 1/227; B44C 1/22; B05D 3/06; B05D 3/10; B05D 3/12; B29C 67/00; B23P 13/00; Y10T 428/13; Y10T 428/24273; Y10T 29/49995
See application file for complete search history.

(56) References Cited

U.S. PATENT DOCUMENTS 5,878,487 A    3/1999  Mcmillan et al.
6,203,885 B1   3/2001  Sher et al.
(Continued)

*Primary Examiner* — Michael C Miggins
(74) *Attorney, Agent, or Firm* — Dorsey & Whitney LLP

(57) ABSTRACT

The present disclosure provides three-dimensional structures and related methods. The three-dimensional structures may define patterns of positive and negative spaces on opposing surfaces that combine to form the three-dimensional structures. The negative spaces of the patterns may intersect to form apertures through the three-dimensional structures, which may define linear or non-linear paths therethrough. The apertures may be configured to provide desirable characteristics with respect to light, sound, and fluid travel therethrough. Further, the three-dimensional structures may be configured to define desired stiffness, weight, and/or flexibility. The three-dimensional structures may be employed in embodiments including heat sinks, housings, speaker or vent covers, springs, etc.

20 Claims, 25 Drawing Sheets

Related U.S. Application Data division of application No. 13/355,437, filed on Jan. 20, 2012, now Pat. No. 9,283,642.

(51) Int. Cl.
| | |
|---|---|
| *B23K 26/38* | (2014.01) |
| *B29C 67/00* | (2017.01) |
| *B44C 1/22* | (2006.01) |
| *B23K 26/362* | (2014.01) |
| *B23K 26/402* | (2014.01) |
| *B23K 26/382* | (2014.01) |
| *B05D 3/06* | (2006.01) |
| *B05D 3/10* | (2006.01) |
| *B05D 3/12* | (2006.01) |
| *H05K 5/03* | (2006.01) |
| *B23K 26/361* | (2014.01) |
| *B23K 103/00* | (2006.01) |

(52) U.S. Cl.
CPC ................ *B44C 1/22* (2013.01); *B44C 1/227* (2013.01); *B44C 1/228* (2013.01); *H05K 5/03* (2013.01); *B23K 2103/50* (2018.08); *Y10T 29/49995* (2015.01); *Y10T 428/13* (2015.01); *Y10T 428/24273* (2015.01)

(56) References Cited

U.S. PATENT DOCUMENTS

| | | |
|---|---|---|
| 7,335,580 B1 | 2/2008 | Buerger, Jr. et al. |
| 7,853,034 B1 | 12/2010 | Gresko |
| 2002/0134752 A1 | 9/2002 | Kawamura et al. |
| 2008/0017918 A1 | 1/2008 | Kim |

THREE-DIMENSIONAL STRUCTURES AND RELATED METHODS OF FORMING THREE-DIMENSIONAL STRUCTURES

CROSS-REFERENCE TO RELATED APPLICATIONS

This application is a continuation of U.S. application Ser. No. 15/017,545, filed Feb. 5, 2016, titled "Three-Dimensional Structures and Related Methods of Forming Three-Dimensional Structures," which is a divisional of U.S. application Ser. No. 13/355,437, filed Jan. 20, 2012, now U.S. Pat. No. 9,283,642, issued on Mar. 15, 2016, of the same title, the contents of which are incorporated herein by reference in their entireties for all purposes.

FIELD

The described embodiments relate generally to three-dimensional structures. In particular, methods for forming three-dimensional structures that may be employed, for example, in the formation of housings for electronic devices are disclosed.

BACKGROUND

Components of electronic devices may include a variety of three-dimensional structures tailored to the specific purpose for which they are employed. In this regard, components may be configured to provide support to the electronic device, provide protection of internal components from the elements; provide for thermal or acoustic transmission therethrough, or serve one or more various other purposes. The components may also be designed to provide a pleasing look and feel.

While existing components may function sufficiently for the purpose for which they are intended, further advances in components defining three-dimensional shapes and advances in the manufacture thereof may be desirable. In this regard, further tailoring of shapes to provide additional functionality and/or simplified manufacture thereof may be desirable. Accordingly, it may be desirable to provide improved structures and improved methods of manufacturing structures.

SUMMARY

The present disclosure generally relates to three-dimensional structures and related methods for forming the three-dimensional structures. The three-dimensional structures may be formed by removing material from first and second surfaces on opposing sides of a body in some embodiments. Example methods of removing material include chemical and laser etching and machining. For example, a first portion of the material may be removed from the first side of the body to define a first pattern of positive and negative space. Similarly, a second portion of the material may be removed from the second side of the body to define a second pattern of positive and negative space. The first pattern and the second pattern may combine to form a three-dimensional structure. In other embodiments material may be combined (e.g., via casting or injection molding) or compressed (e.g., via forging) to form the three-dimensional structures.

The negative space of the first pattern may intersect the negative space of the second pattern to define apertures (e.g., through holes) that extend through the body. The patterns may be configured to define apertures having desired properties. For example, when a first portion of the aperture formed by the negative space of the first pattern and a second portion of the aperture formed by the negative space of the second pattern extend along parallel axes, linear paths may be defined through the three-dimensional structures. In other embodiments the first portion and the second portion may extend along non-parallel axes. Depending on the configuration thereof, linear or non-linear paths may be defined through the apertures, which define various optical, thermal, and acoustic properties.

Accordingly, the properties of the three-dimensional structures may be tailored to define a desired configuration. For example, when it is not desirable to allow a user to view through the three-dimensional structure, the apertures may be configured to define a non-linear path there through, while still allowing for airflow and/or sound to travel through the apertures. Additionally, a desired ratio and configuration of negative space and positive space may be selected to define a structure having a desired level of lightness, stiffness, flexibility, and/or other characteristics, depending on the application thereof. Thus, for example, the three-dimensional structures may be employed as housings for electronic devices and speaker or vent covers therefore. The three-dimensional structures may also be employed as springs or heat sinks, in various other embodiments thereof.

Other aspects and advantages of the present disclosure will become apparent from the following.

BRIEF DESCRIPTION OF THE DRAWINGS

Figure 1A:
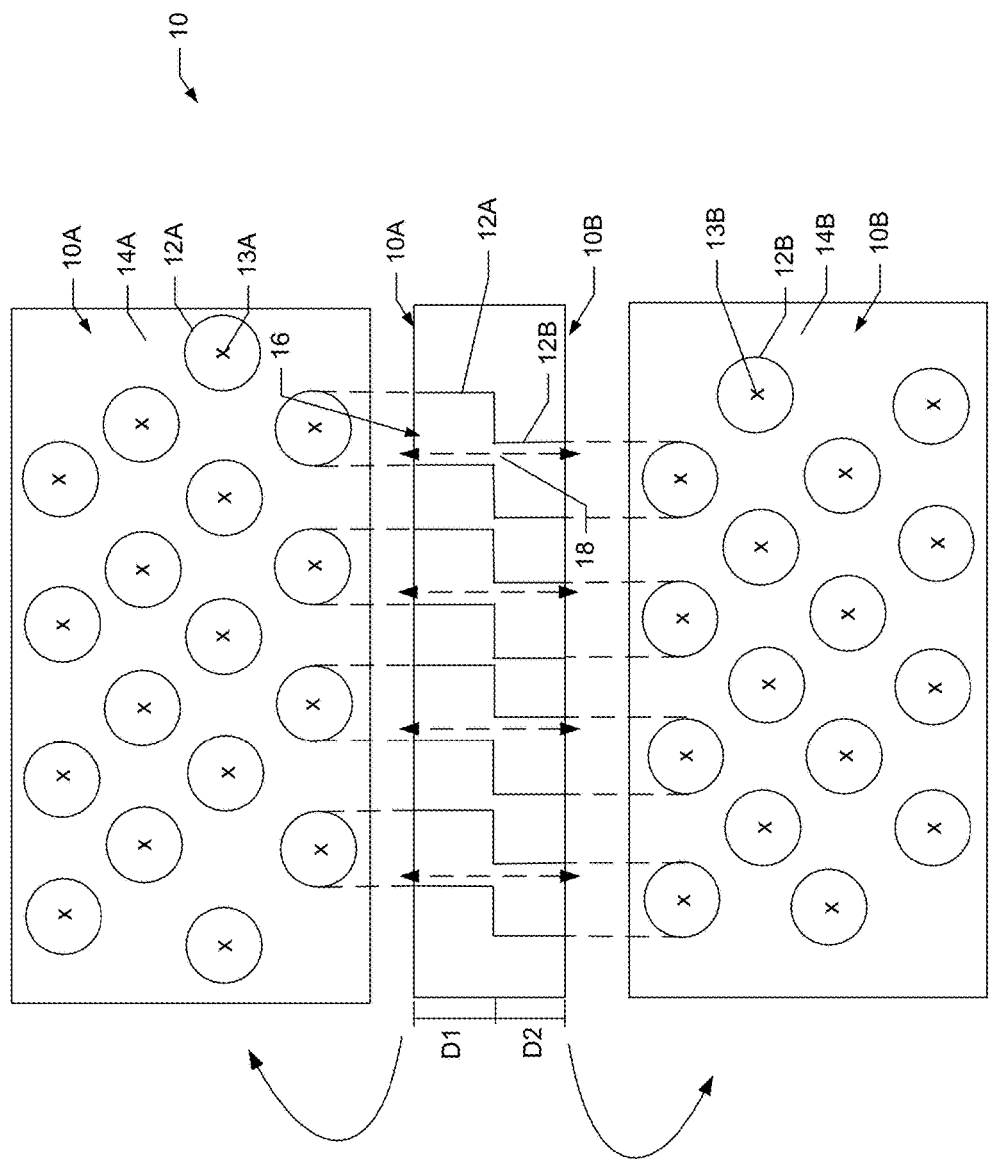
Figure 1B:
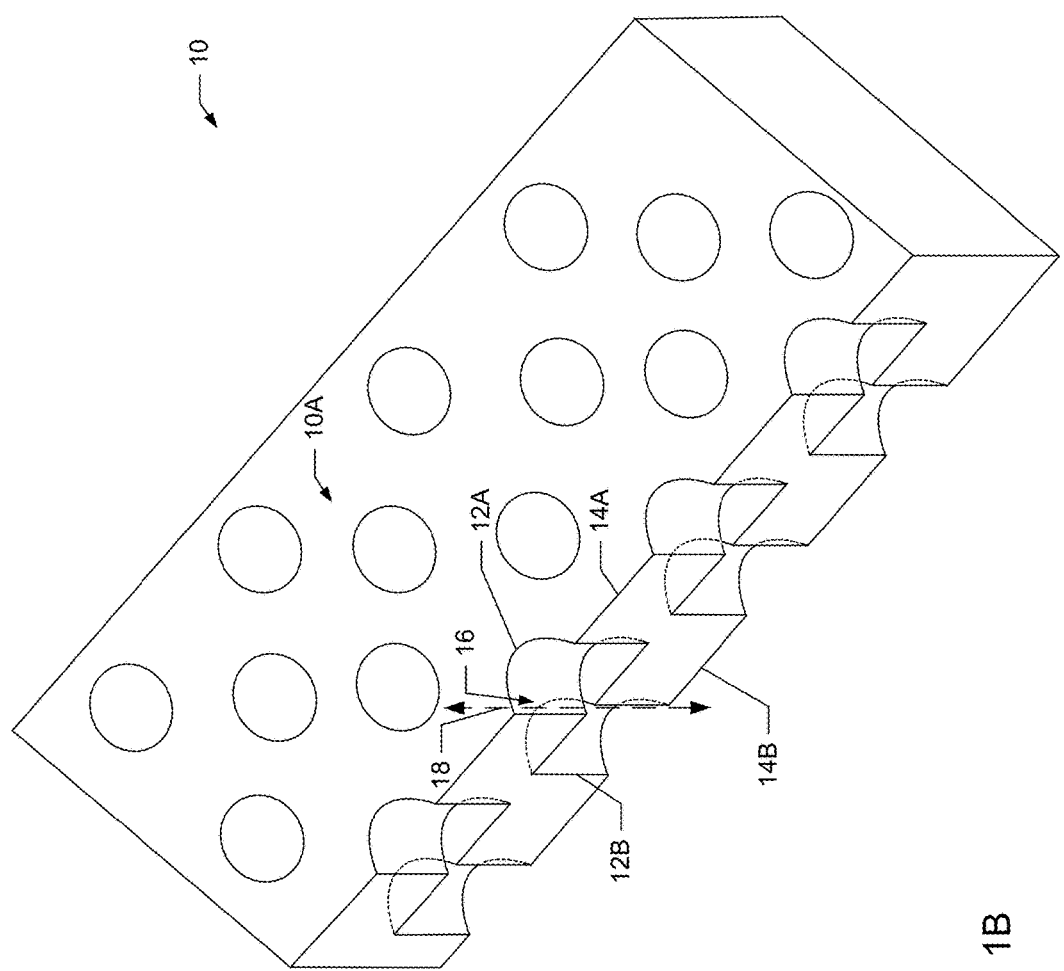
Figure 2:
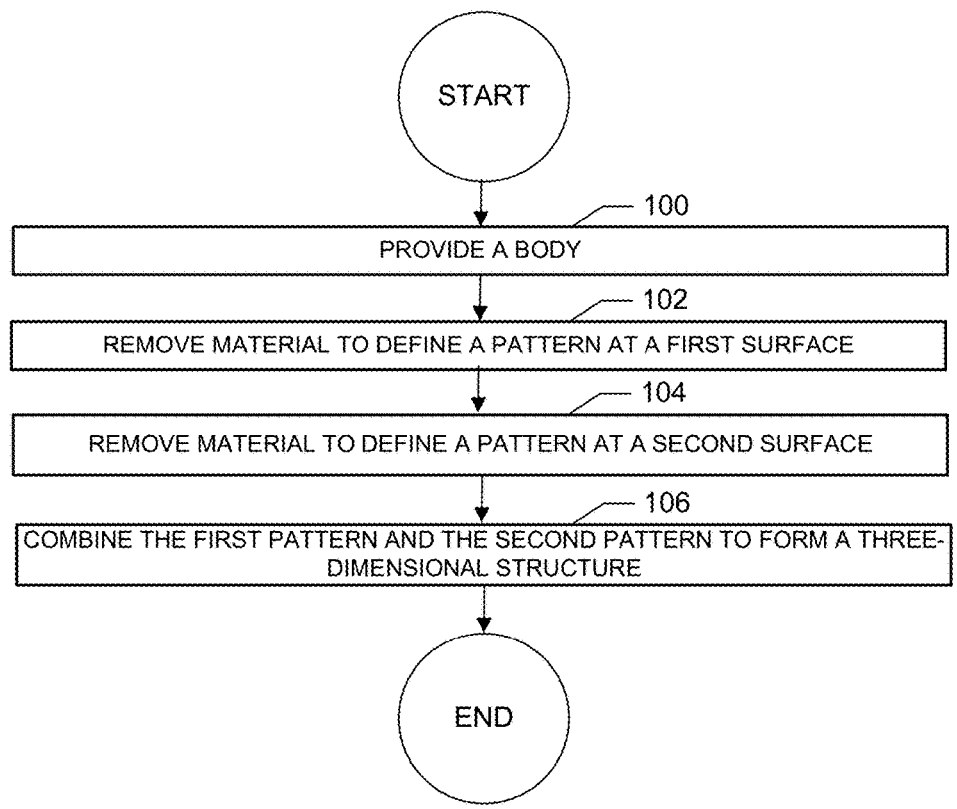
Figure 3:
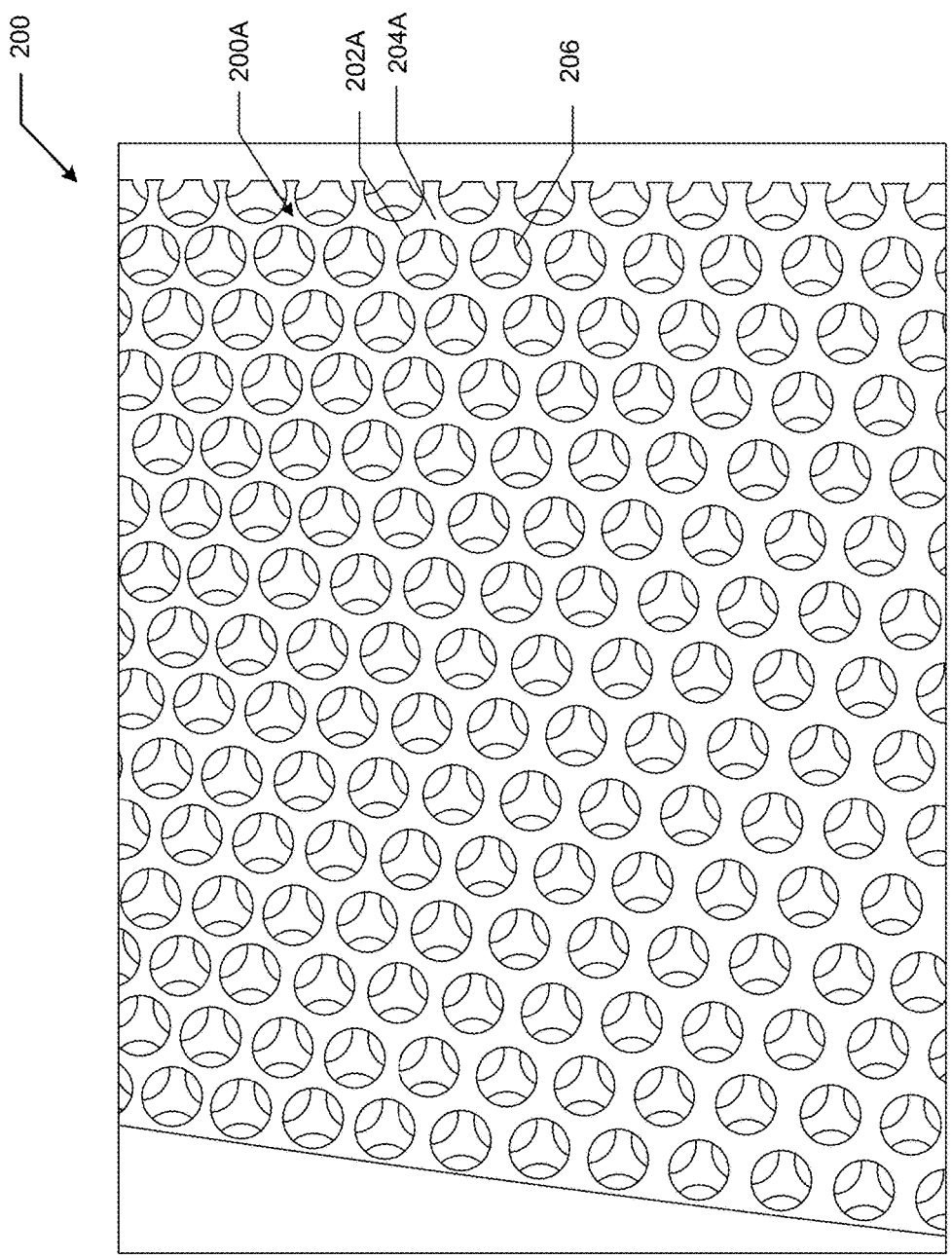
Figure 4:
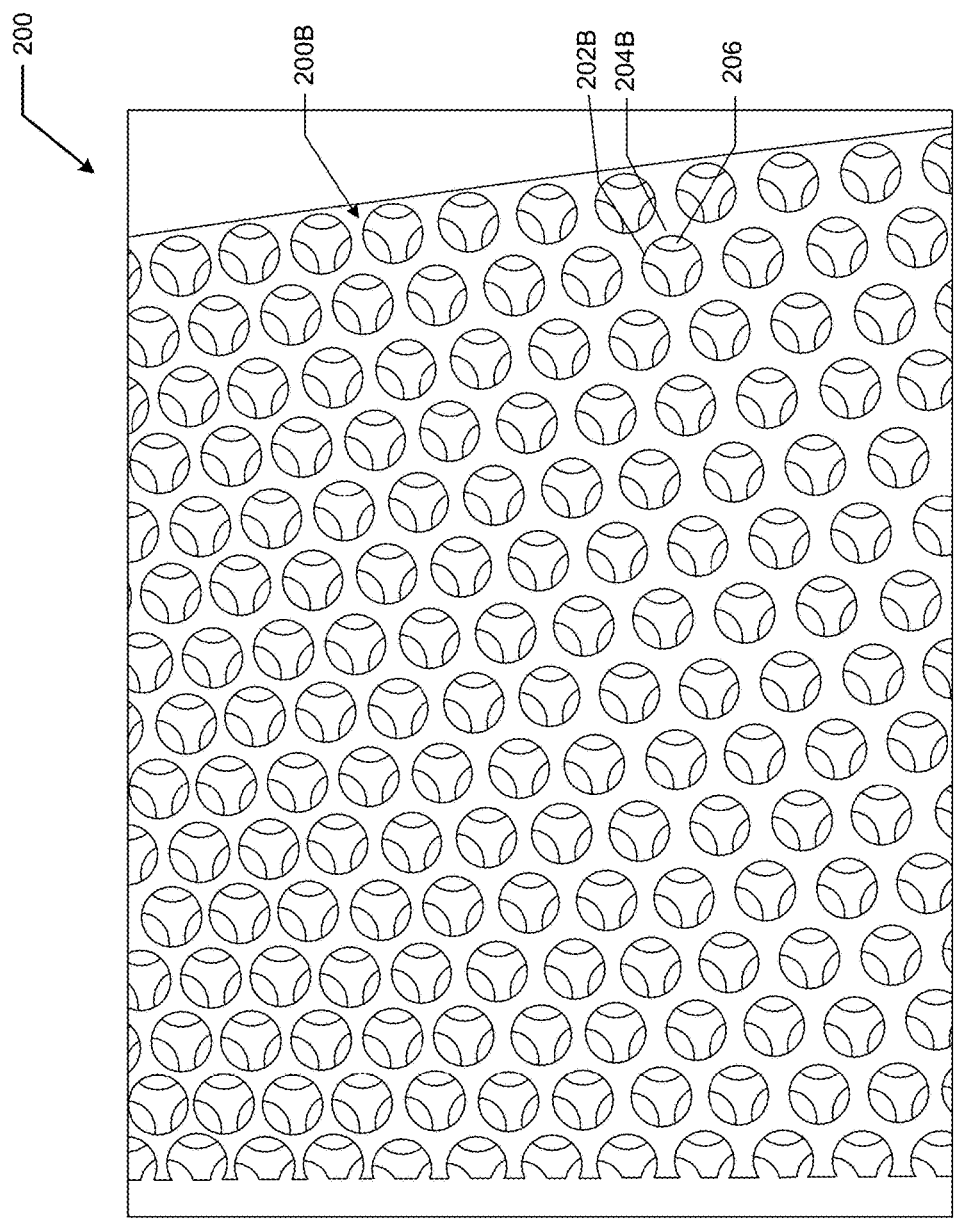
Figure 5:
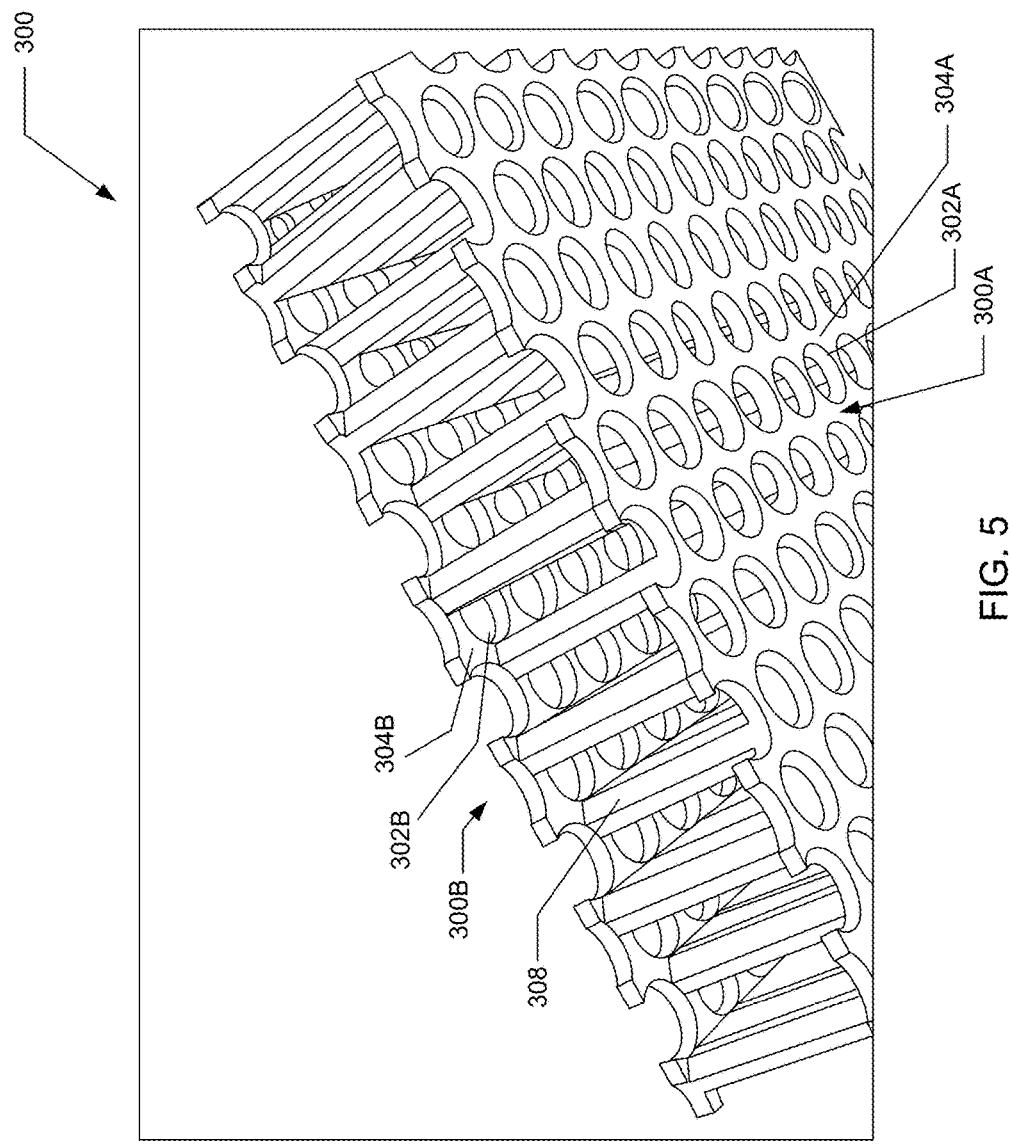
Figure 6:
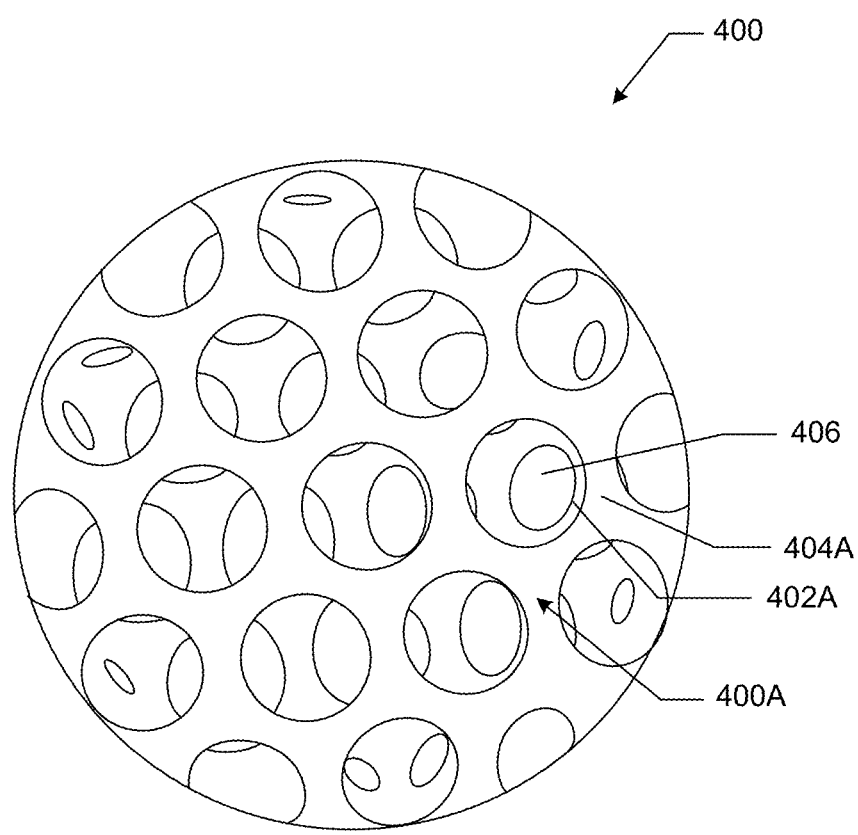
Figure 7:
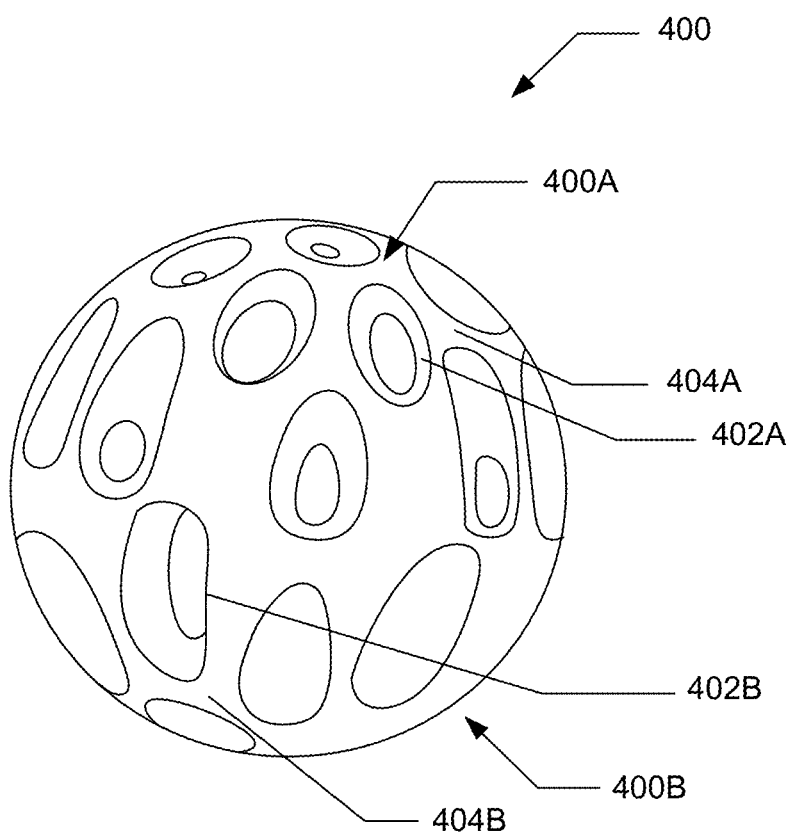
Figure 8:
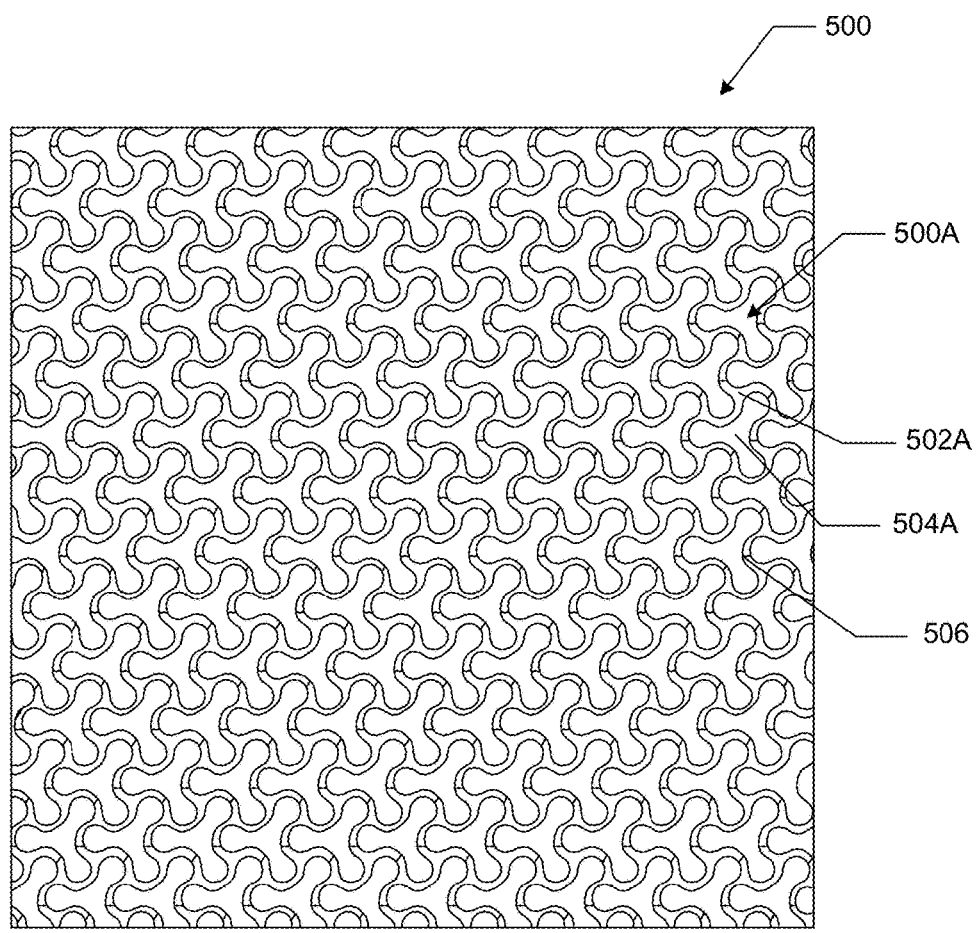
Figure 9:
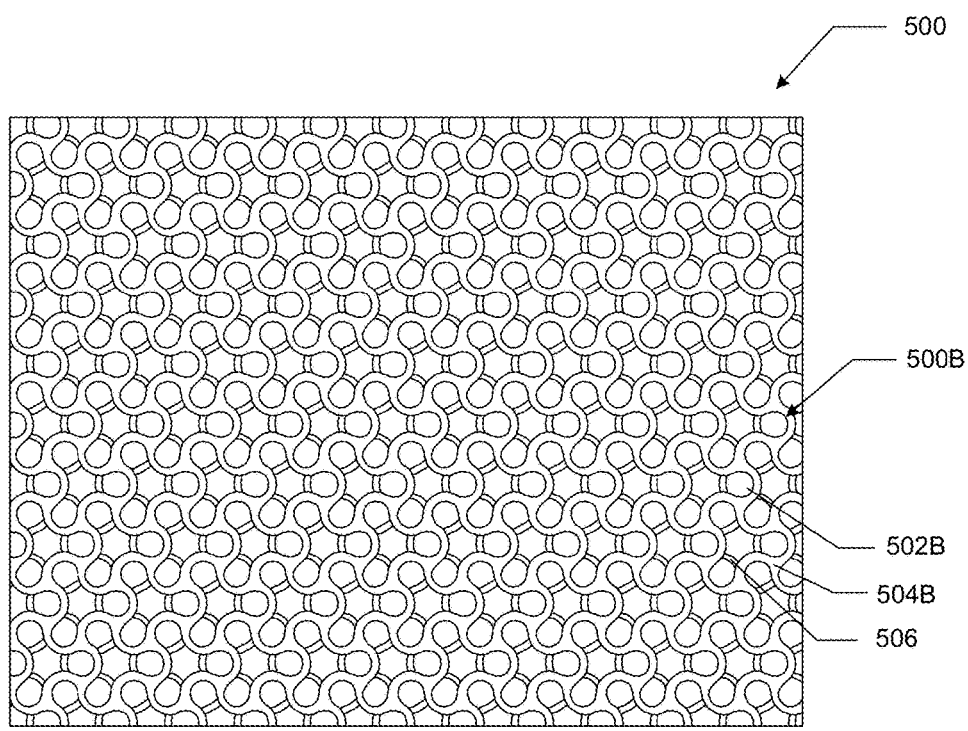
Figure 10:
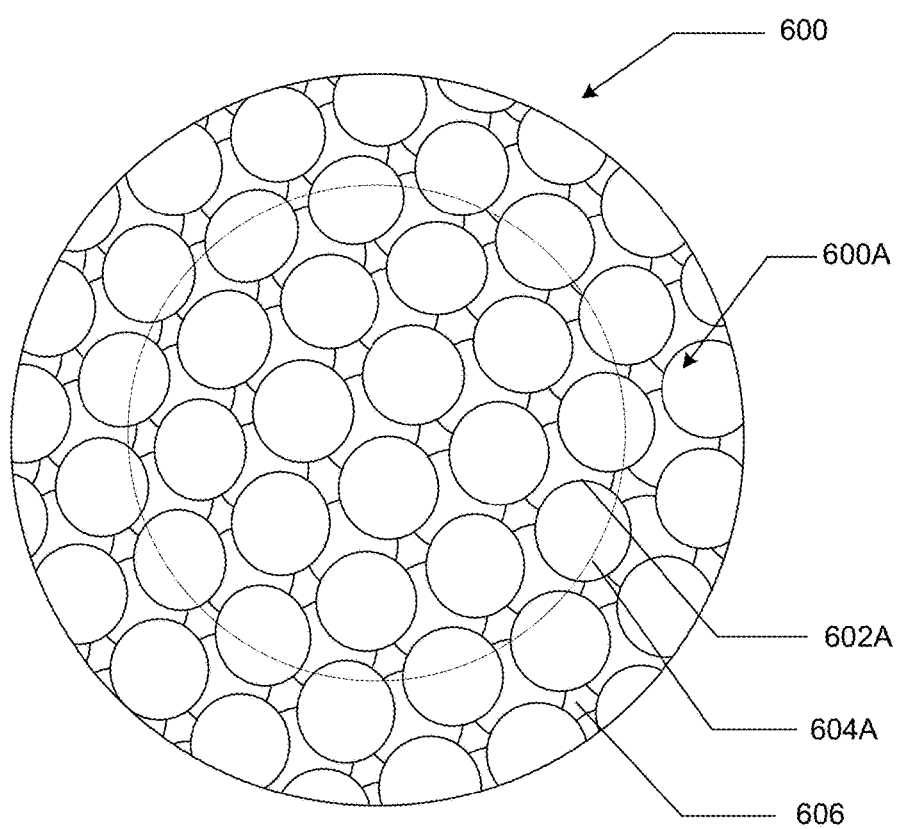
Figure 11:
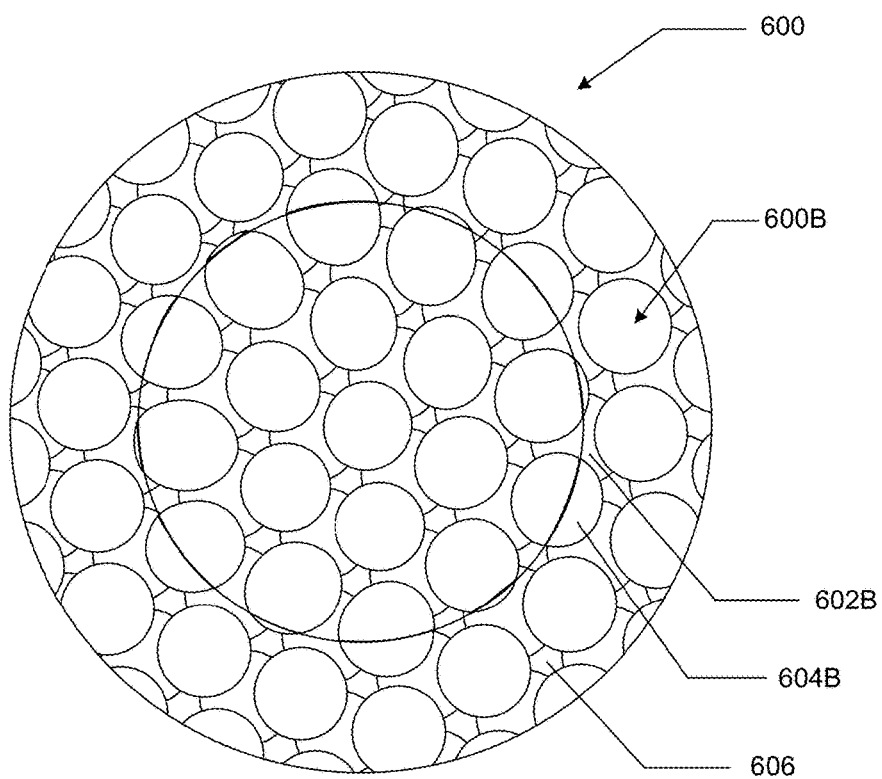
Figure 12:
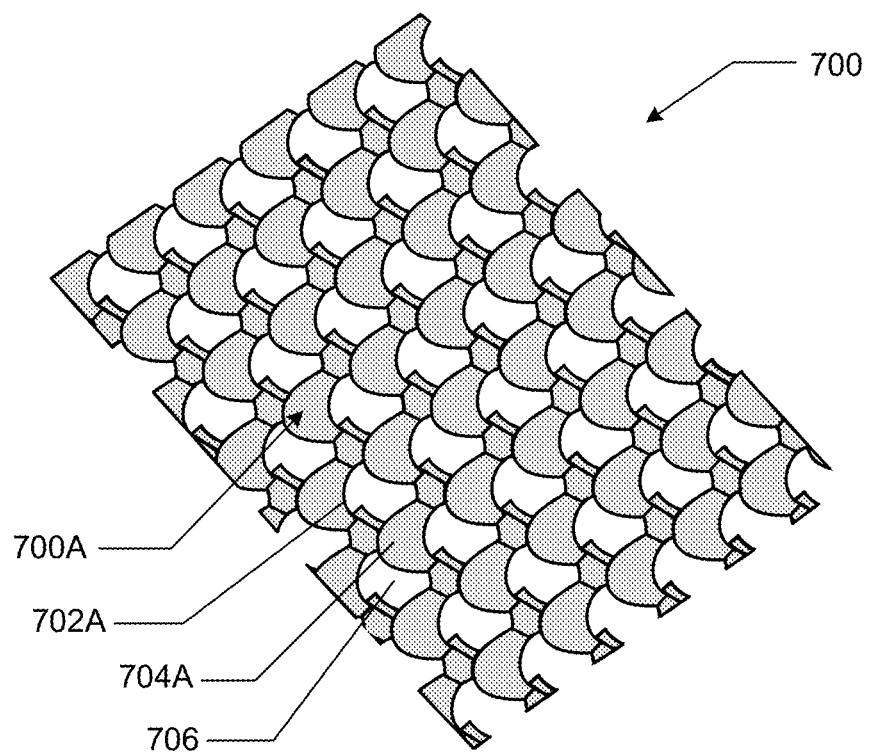
Figure 13:
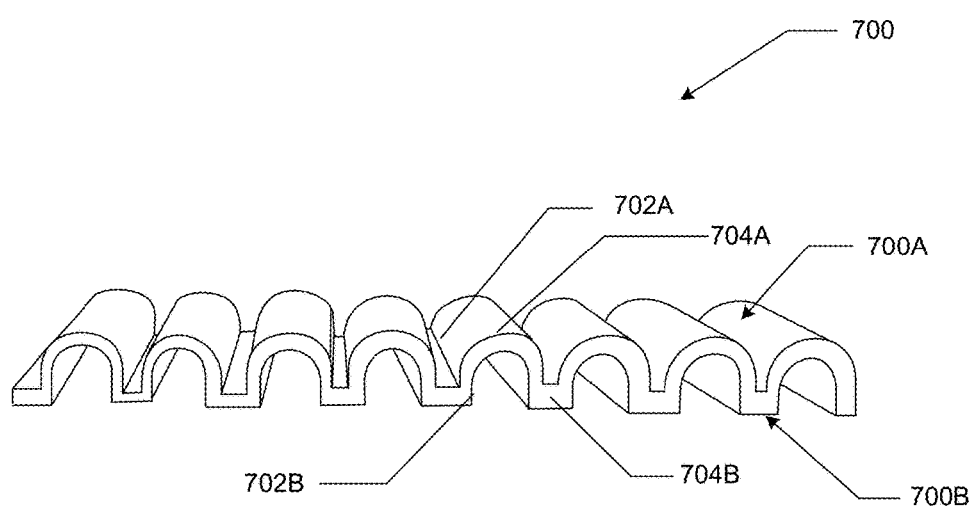
Figure 14:
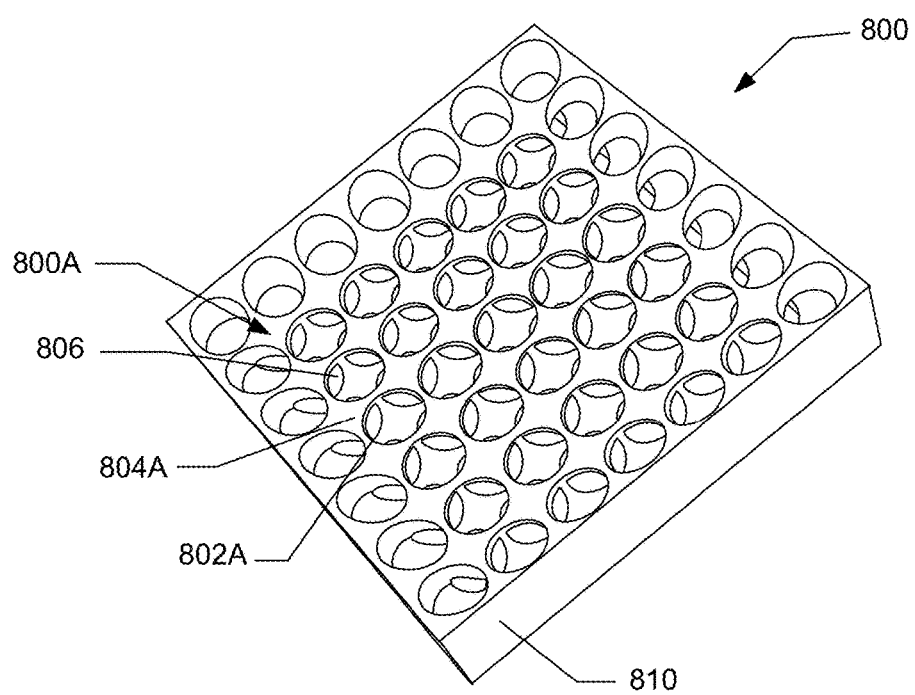
Figure 15:
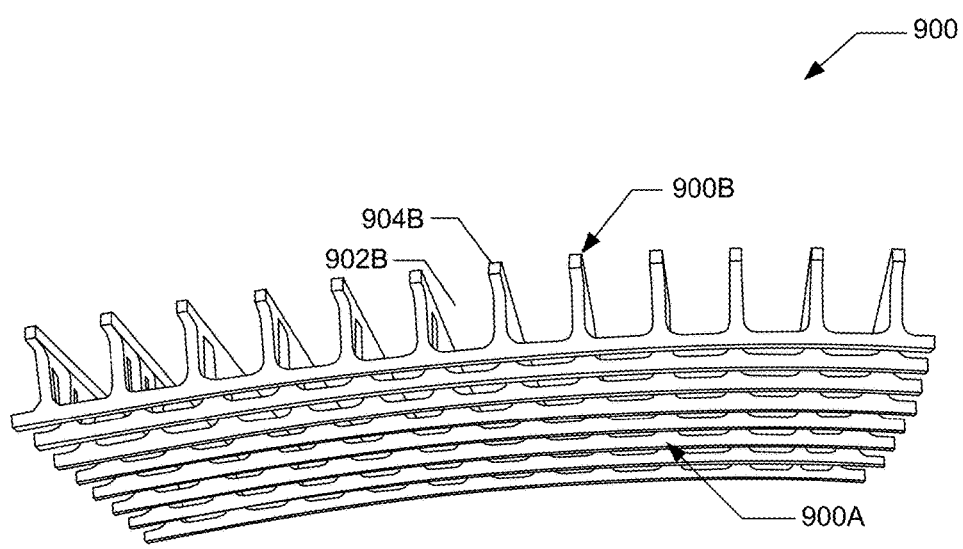
Figure 16:
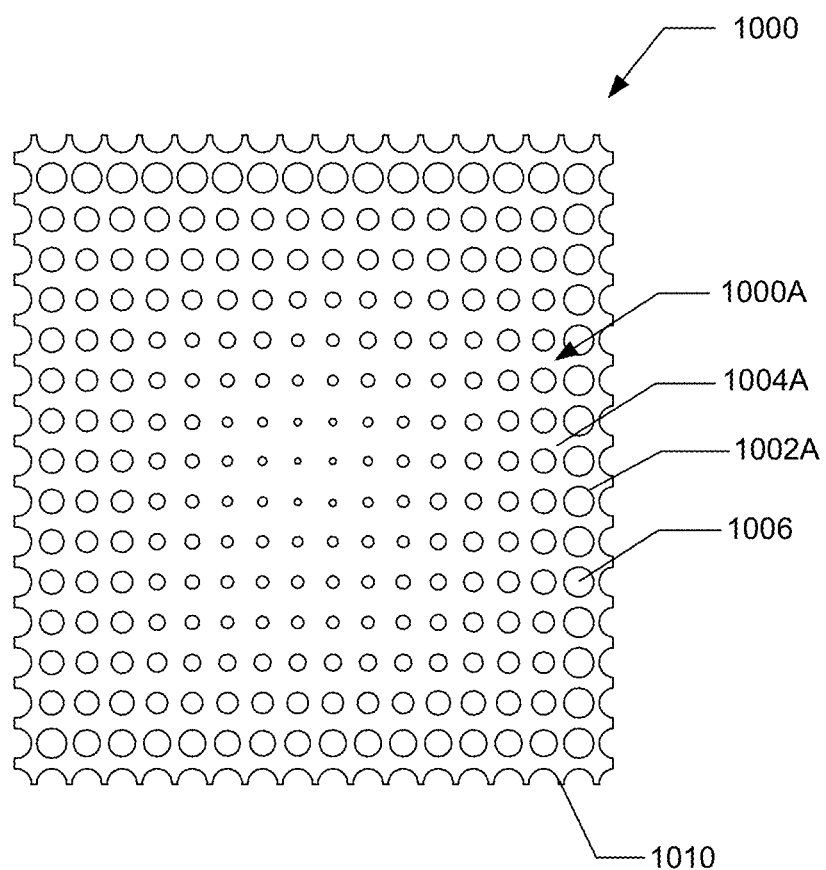
Figure 17:
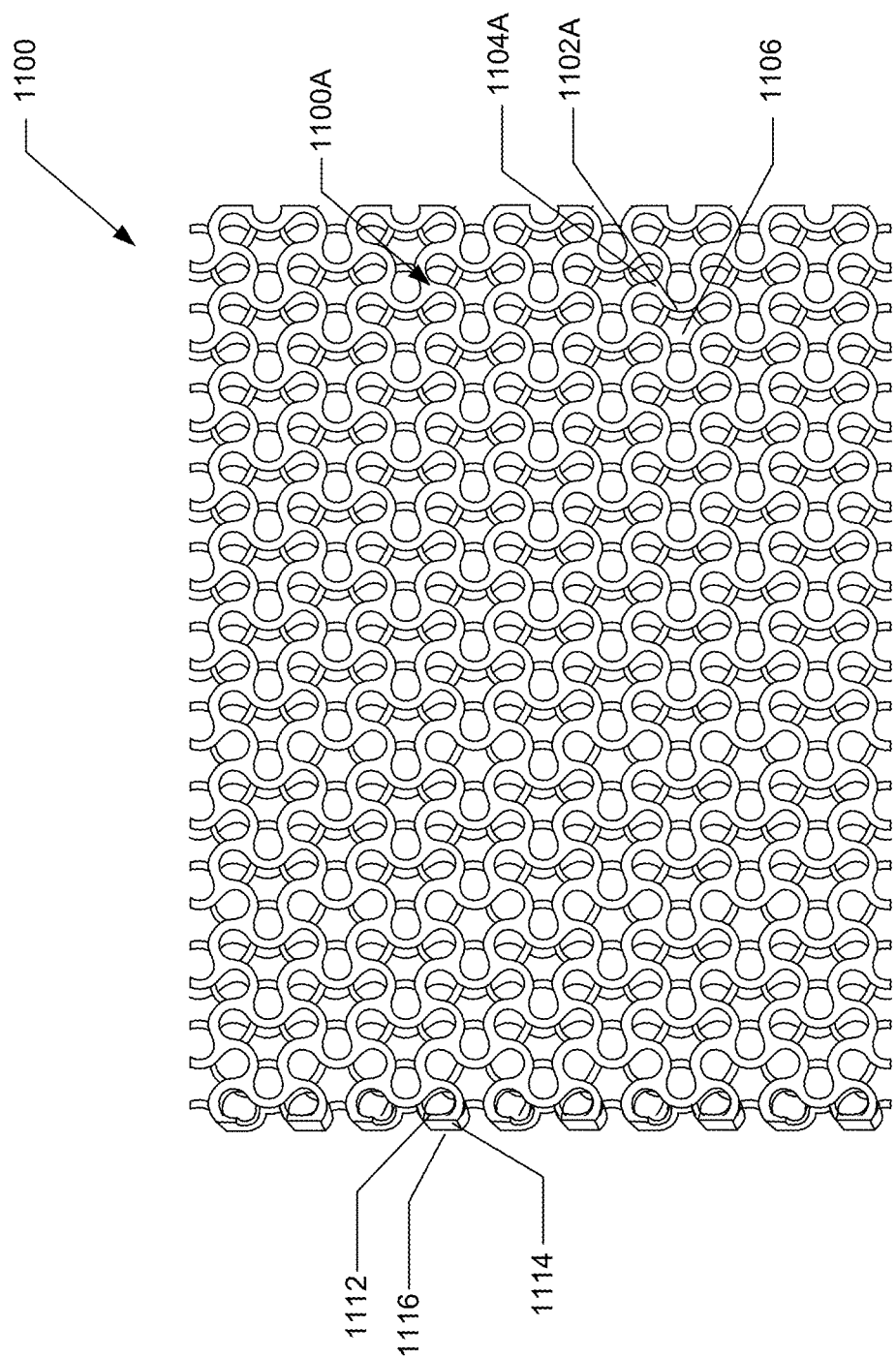
Figure 18:
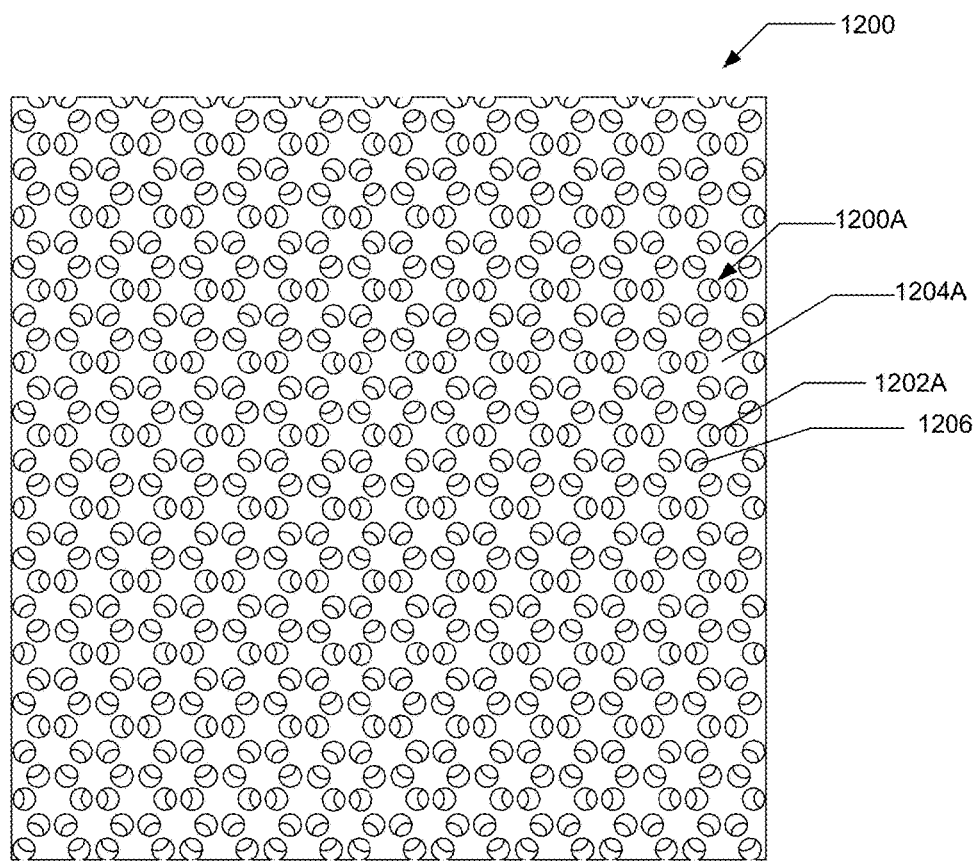
Figure 19:
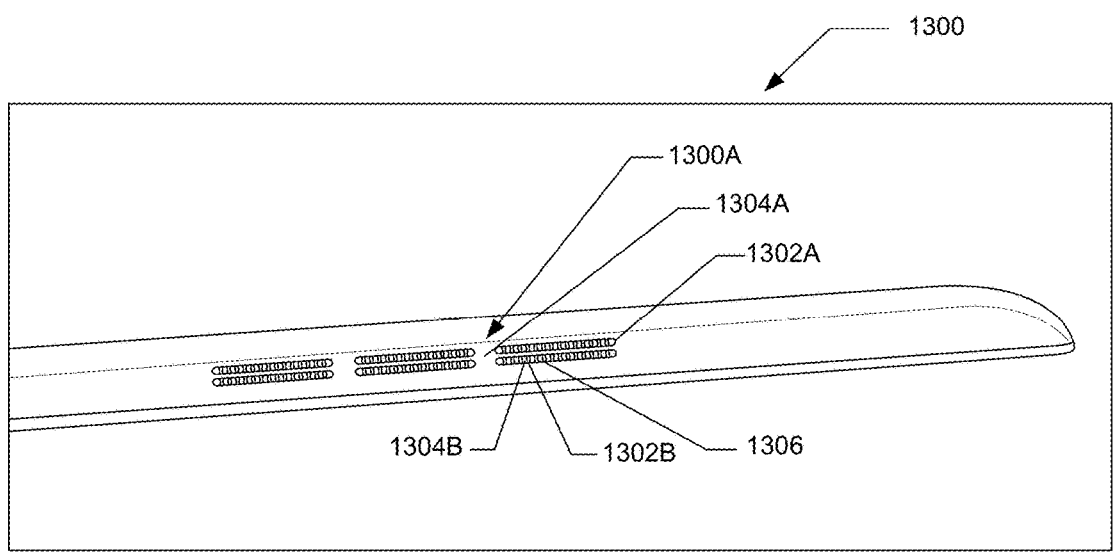
Figure 20:
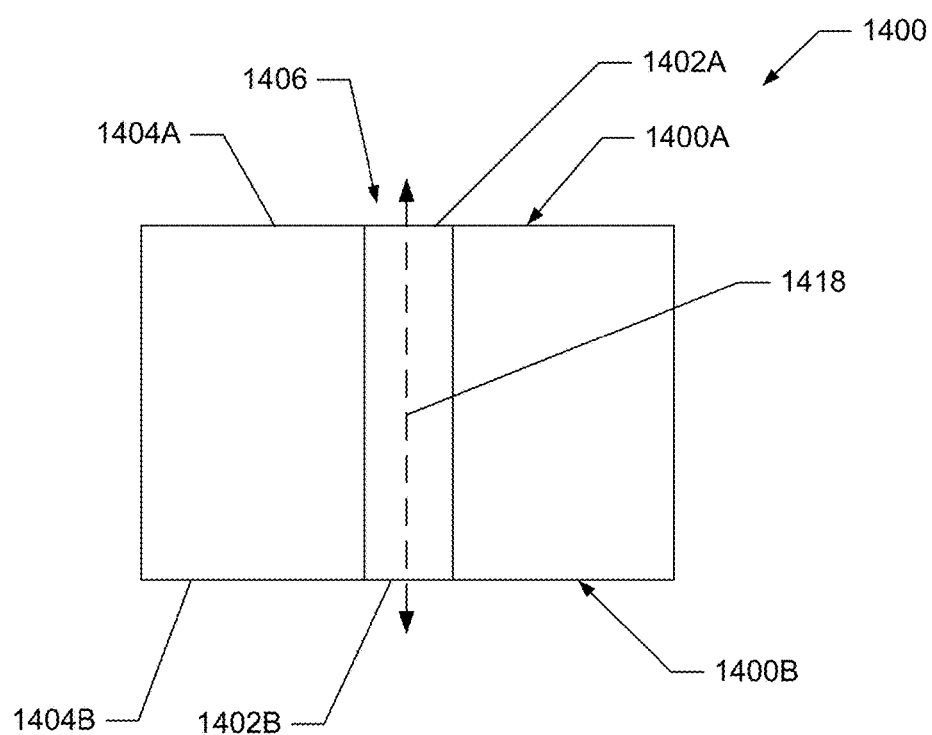
Figure 21:
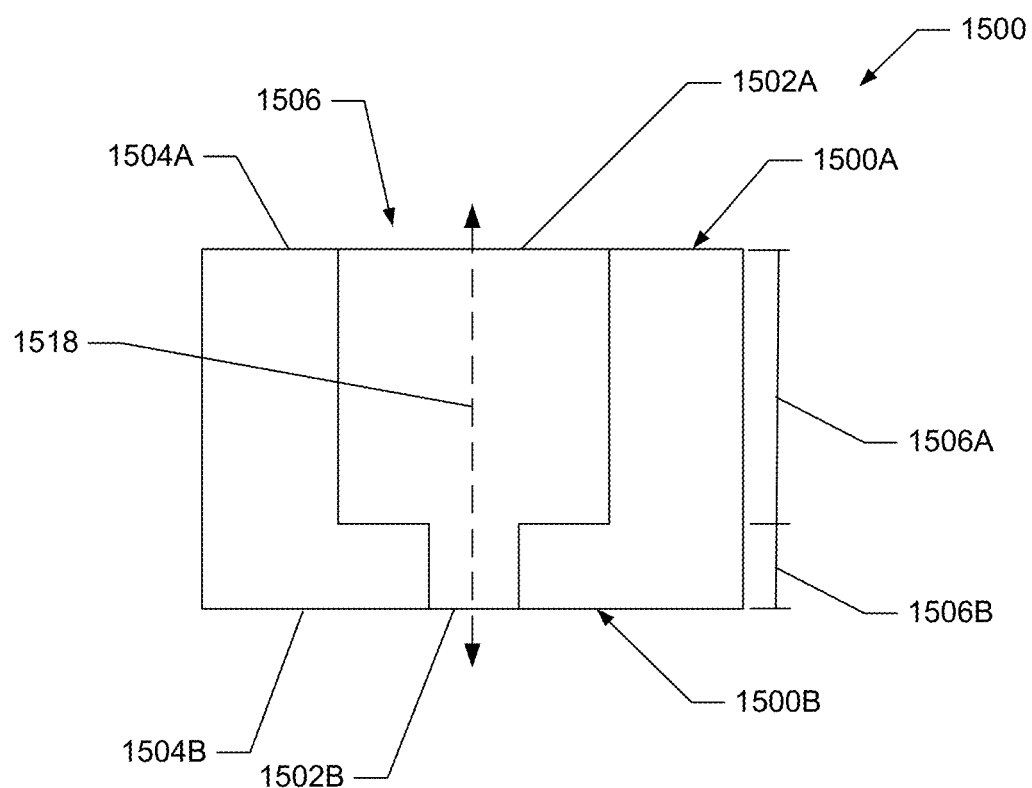
Figure 22:
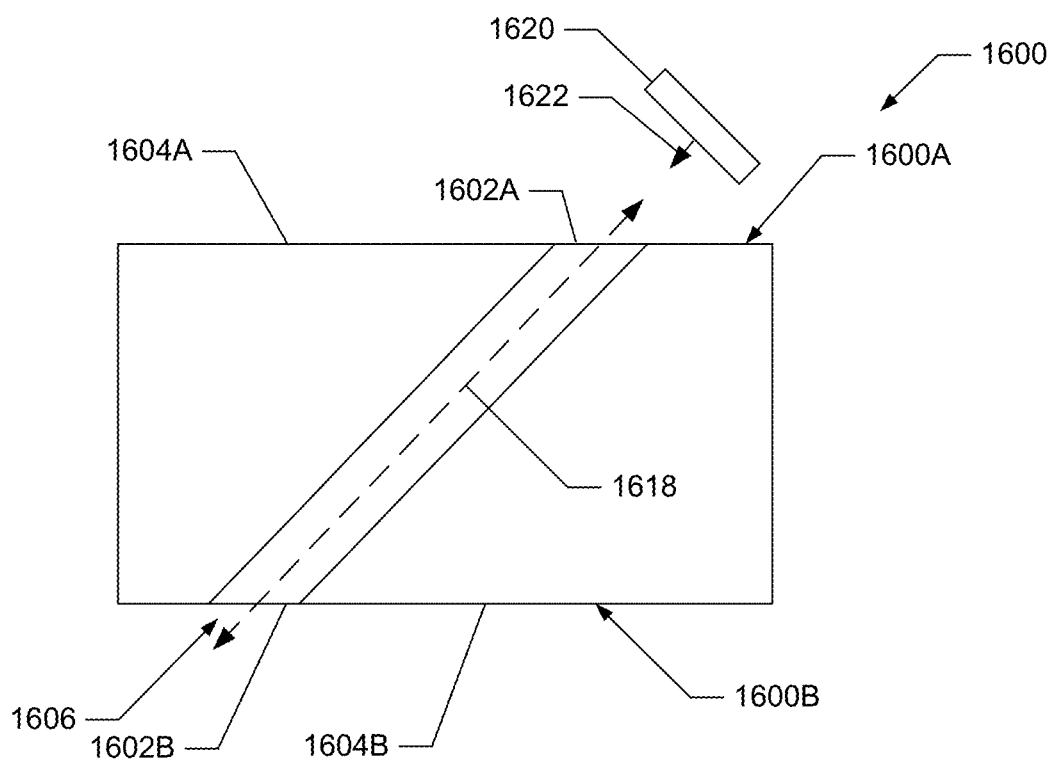
Figure 23:
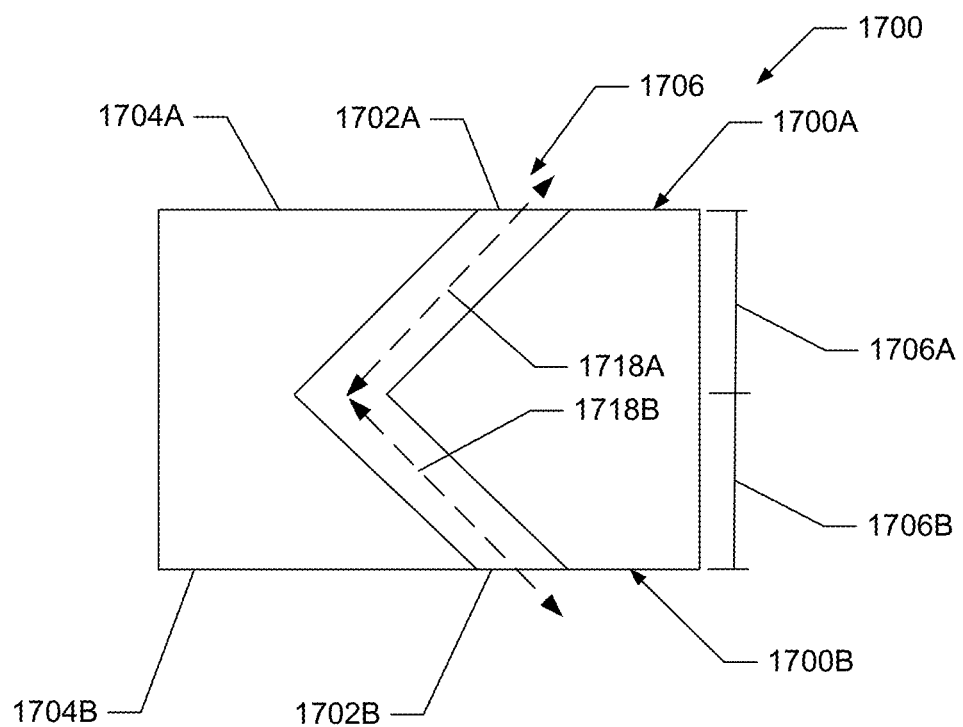
Figure 24:
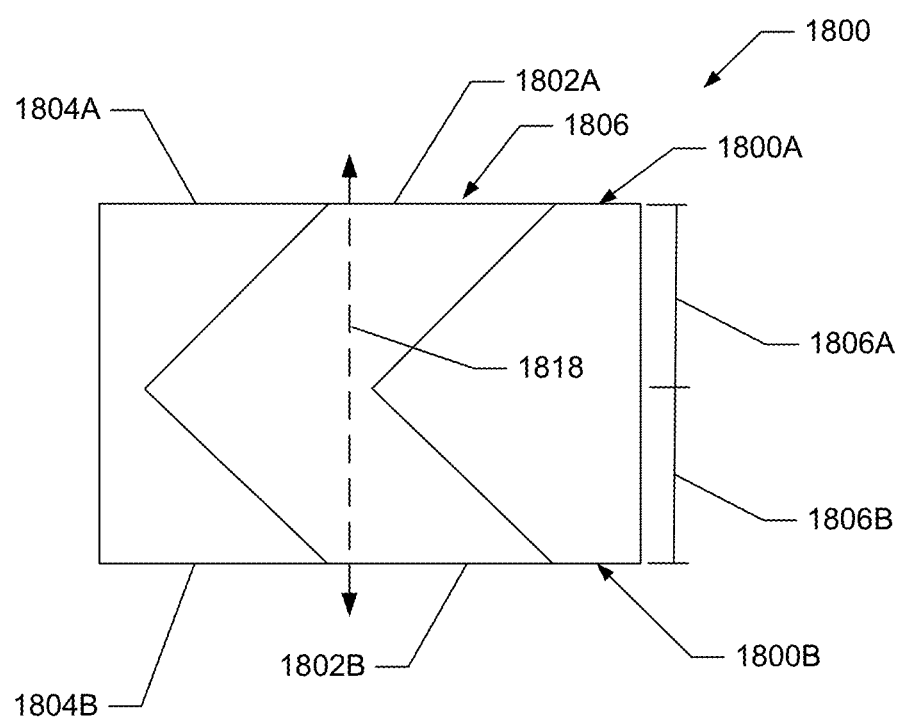

Having thus described the disclosure in general terms, reference will now be made to the accompanying figures, wherein:

FIG. 1A illustrates a sectional view through an example embodiment of a three-dimensional structure having first and second opposing surfaces defining patterns of positive and negative space;

FIG. 1B illustrates a perspective sectional view through the example embodiment of the three-dimensional structure of FIG. 1A;

FIG. 2 illustrates a block diagram of an example embodiment of a method for forming a three-dimensional structure;

FIG. 3 illustrates a first surface of an example embodiment of a three-dimensional structure including the same pattern offset on two sides;

FIG. 4 illustrates a second surface of the three-dimensional structure of FIG. 3;

FIG. 5 illustrates an example embodiment of a three-dimensional structure that includes connecting members defining a box structure;

FIG. 6 illustrates a first surface of an example embodiment of a spherical three-dimensional structure;

FIG. 7 illustrates a side view of the three-dimensional structure of FIG. 6;

FIG. 8 illustrates a first surface of an example embodiment of a three-dimensional structure defining a first pattern;

FIG. 9 illustrates a second surface of the three-dimensional structure of FIG. 8 defining a second pattern that is the inverse of the first pattern;

FIG. 10 illustrates a first surface of an example embodiment of a three-dimensional structure defining a convex portion at the first surface;

FIG. 11 illustrates a second surface of the three-dimensional structure of FIG. 10 defining a concave portion at the second surface;

FIG. 12 illustrates a first surface of an example embodiment of a three-dimensional structure defining a plurality of curved portions;

FIG. 13 illustrates a side view of the three-dimensional structure of FIG. 12;

FIG. 14 illustrates a first surface of an example embodiment of a three-dimensional structure wherein a pattern defined at the first surface does not extend to peripheral edges of the three-dimensional structure;

FIG. 15 illustrates a perspective view of an example embodiment of a three-dimensional structure wherein the patterns at the first surface and the second surface define a greater portion of negative space than positive space;

FIG. 16 illustrates an example embodiment of a three-dimensional structure wherein the first pattern and the second pattern are identical and define smaller negative spaces at the center of the three-dimensional structure than at the edges of the three-dimensional structure;

FIG. 17 illustrates an example embodiment of a three-dimensional structure comprising three-layers;

FIG. 18 illustrates an example embodiment of a three-dimensional structure defining apertures that extend at a plurality of angles therethrough;

FIG. 19 illustrates an example embodiment of a three-dimensional structure that defines a housing for a portable electronic device in which positive spaces of first and second spaces of patterns define a speaker cover;

FIG. 20 illustrates a cross-sectional view through an example embodiment of a three-dimensional structure in which an aperture defines a linear path therethrough that is perpendicular to first and second opposing surfaces;

FIG. 21 illustrates a cross-sectional view through an example embodiment of a three-dimensional structure in which an aperture defines a linear path therethrough that is perpendicular to first and second opposing surfaces and the aperture includes first and second portions having differing dimensions;

FIG. 22 illustrates a cross-sectional view through an example embodiment of a three-dimensional structure in which the aperture extends at a non-perpendicular angle relative to the first and second surfaces and defines a linear path therethrough;

FIG. 23 illustrates a cross-sectional view through an example embodiment of a three-dimensional structure in which the aperture includes first and second portions that extend at different angles and intersect such that a non-linear path is defined therethrough; and FIG. 24 illustrates a cross-sectional view through an example embodiment of a three-dimensional structure in which the aperture includes first and second portions that extend at different angles and intersect such that a linear path is defined therethrough.

DETAILED DESCRIPTION

The present disclosure in one embodiment relates to three-dimensional structures. The three-dimensional structures may be formed by a variety of methods according to additional embodiments of the disclosure. For example, the structures disclosed herein may be formed by etching (e.g., chemical etching or laser etching), machining, casting, forging, or injection molding. However, various other methods of forming the three-dimensional structures may be employed in other embodiments. Further, multiple methods of forming the structures may be employed to form a single structure. For example, etching may be employed to form a first surface of the structure, whereas machining may be employed to form a second surface of the structure. Thus, although the methods disclosed herein are generally discussed in terms of removing material, this need not be the case in all embodiments.

The present disclosure in one embodiment relates to three-dimensional structures. The three-dimensional structures may be formed by a variety of methods according to additional embodiments of the disclosure. For example, the structures disclosed herein may be formed by etching (e.g., chemical etching or laser etching), machining, casting, forging, or injection molding. However, various other methods of forming the three-dimensional structures may be employed in other embodiments. Further, multiple methods of forming the structures may be employed to form a single structure. For example, etching may be employed to form a first surface of the structure, whereas machining may be employed to form a second surface of the structure. Thus, although the methods disclosed herein are generally discussed in terms of removing material, this need not be the case in all embodiments.

The various three-dimensional structures disclosed herein may be specifically configured to define characteristics that are suitable for the intended use of the structures. For example, lightweight structures may be formed by removing a significant portion of the body from which the three-dimensional structures are formed. Further, relatively strong, yet lightweight box-shaped structures may be formed by removing material from both sides of a body such that the two sides are separated from one-another, but connecting members may extend between the two surfaces to provide the three-dimensional structure with a desired amount of stiffness. In another embodiment the three-dimensional structure may be defined by removing material such that the structure is useable as a spring or a resilient member that may, for example, be employed to form protective packaging. Accordingly, as described in greater detail below, the method disclosed herein may produce a large variety of three-dimensional structures that may be employed for a variety of purposes.

In this regard, FIGS. 1A and 1B illustrate an embodiment of a three-dimensional structure 10 that may be formed in accordance with the methods disclosed herein. FIG. 1A illustrates top, bottom, and sectional views through the three-dimensional structure 10. FIG. 1B illustrates a perspective sectional view through the three-dimensional structure 10.

The three-dimensional structure 10 may include a body defining first 10A and second 10B opposing surfaces from which material is removed at negative spaces 12A, 12B that extend into the material along respective axes 13A, 13B. Further, material may be retained at positive spaces 14A, 14B. As illustrated, the positive 14A, 14B and negative 12A, 12B spaces may be provided in patterns at the first 10A and second 10B surfaces.

As illustrated in the cross-section through the three-dimensional structure 10, the negative spaces 12A of the first pattern may extend along respective axes 13A from the first surface 10A into the body to a depth D1. Similarly, the negative spaces 12B of the second pattern may extend along respective axes 13B from the second surface 10B into the body to a depth D2. Although illustrated as such, the axes 13A of each of the negative spaces 12A of the first pattern need not be parallel to one another or parallel to the axes 13B of each of the negative spaces 12B of the second pattern in all embodiments.

Due to the relative positions of the first pattern of positive 14A and negative 12A spaces relative to the second pattern of positive 14B and negative 12B spaces, apertures 16 (e.g., through holes) may be defined through the three-dimensional structure 10 at the positions where the negative spaces of the first and second patterns intersect. Thus, the apertures 16 may extend along axes 18 through the three-dimensional structure. In this embodiment, the axis 18 of each aperture 16 is perpendicular to the first surface 10A and the second surface 10B.

However, in other embodiments the axes of the apertures may extend at other angles relative to the surfaces of the three-dimensional structure. Further, in some embodiments the respective axes of the negative spaces of the first pattern and the negative spaces of the second pattern may be non-parallel, such that apertures defined through the body do not extend along a single axis. Additionally, in some embodiments the negative spaces of the first pattern and the negative spaces of the second pattern may not intersect, such that there are not through holes extending completely through the thickness of the body. Elaborating discussion with respect to these additional embodiments is provided below.

One example embodiment of a method for forming a three-dimensional structure is illustrated in FIG. 2. In this regard, the method may include providing a body defining a first surface and a second surface at operation 100, removing a first portion of the material from the body to define a first pattern of a positive space and a negative space at the first surface at operation 102, and removing a second portion of the material from the body to define a second pattern of a positive space and a negative space at the second surface at operation 104. As illustrated at operation 106, the first pattern and the second pattern combine to form the three-dimensional structure.

Thus, in one example embodiment, the three dimensional structure may be formed by removing material from first and second surfaces of a body. In this regard, first and second surfaces, as used herein, refer to surfaces at differing positions on a body. Thus, for example, a body in the form of a sphere may be considered to define multiple surfaces, even though the sphere may as a hole define a single surface. Accordingly, providing a body at operation 100 is not restricted to any particular configuration.

The method may additionally include applying a surface finish to at least one of the first surface and the second surface. The surface finish may include one or more known surfaces (e.g., polishing, sanding, anodizing, painting, and/or buffing). Applying the surface finish may be conducted prior to removing the portion of the material in some embodiments. For example, a surface finish may be applied to the first surface prior to removing a first portion of the material at operation 102. Alternatively or additionally, a surface finish may be applied to the second surface prior to removing a second portion of the material at operation 104. In this regard, applying a surface finish prior to removing material may be preferable in some embodiments in that the various methods for removing material disclosed herein (e.g., machining, chemical etching, and laser etching) may be configured to produce clean, relatively sharp edges at the transitions between the negative and positive spaces. These transitions between the positive and negative spaces may for example, provide features that may be gripped by a user of a product, and/or which may be aesthetically pleasing. Conversely, removing the material may be conducted prior to applying a surface finish in other embodiments. This order of operations may be preferable wherein smoother transitions are preferable between the negative and positive spaces.

With respect to removing a first portion of the material from the body to define a first pattern of a positive space and a negative space at the first surface at operation 102 and removing a second portion of the material from the body to define a second pattern of a positive space and a negative space at the second surface at operation 104, positive space, as used herein, refers to space in which the material defining the body is retained. Conversely, negative space, as used herein, refers to the space at which material of the body is removed. Further, a pattern, as used herein, refers to a regular or repetitive form, order, or arrangement of the positive and negative spaces.

As noted above, the first pattern and the second pattern combine to form the three-dimensional structure. In this regard, the relationship between the two patterns of positive and negative space causes the three-dimensional structure to define a shape as a whole that differs from the initial shape of the body, the shape defined by the first pattern alone, and the shape of the second pattern alone. Thus, the combined result of applying the two patterns to the body is a three-dimensional structure with unique characteristics differing from the initial shape of the body, the shape defined by the first pattern alone, and the shape of the second pattern alone.

Removing the first portion of the material at operation 102 and removing the second portion of the material at operation 104 may take various forms. For example, one or both of these operations 102, 104 may include laser etching, machining, and/or chemical etching the body. As noted above these, these embodiments may be combined in some embodiments. For example, the first surface may be laser etched at operation 102 and the second surface may be machined at operation 104. Further, multiple operations may be applied to a single surface in some instances. For example, removing the first portion of the material at operation 102 may include both laser and chemical etching. Additionally, removing the first portion of the material at operation 102 and removing the second portion of the material at operation 104 may be conducted sequentially (e.g., one after the other) or simultaneously.

In one example embodiment, the three-dimensional structure is formed by chemical etching. In this embodiment, the method may include applying a mask (e.g., a masking layer) to the first surface and applying a mask to the second surface. Thus, a single mask may be applied to the body that extends to both the first surface and the second surface, or multiple masks may be employed to mask the first surface and the second surface. Various embodiments of masks may be employed. In one embodiment the mask may include a tape, paint, an elastomer (e.g., rubber or neoprene), a plastic (e.g., polyvinyl chloride, polyethylene, or polystyrene) and/or a photo resist.

Chemical etching may also include applying an etchant to the first surface and applying an etchant to the second surface. The etchant may be an acid, base, or any other chemical configured to remove material from the body to define the negative space of the first surface and the negative space of the second surface. Conversely, the mask and the etchant may be configured such that the mask substantially prevents removal of the material at locations where the mask is positioned on the surface of the body. Accordingly, the positive space of the first surface and the positive space of the second surface may substantially correspond to the locations at which the mask is positioned on the first surface and the second surface.

The same etchant may be employed for both the first surface and the second surface in some embodiments, whereas different etchants may be employed in other embodiments. Further, etchant may be applied to the first surface and the second surface simultaneously, or sequentially. The etchant may be applied to the body via a variety of methods including, for example, spraying and/or immersion.

In some embodiments the etchant may remove material from the first surface and the second surface such that the negative spaces thereof extend to the same depth (see, e.g., D1 and D2 in FIG. 1A). However, in other embodiments the etchant may remove material such that the negative spaces extend to differing first and second depths. In this regard, as noted above, in one embodiment different etchants may be applied to the first surface and the second surface. For example, the etchants may be different chemicals, and/or different concentrations of the same chemical. Alternatively or additionally, the etchants may be heated to different temperatures and/or applied to the body for differing periods of time to cause the negative spaces of the first surface and the negative spaces of the second surface to extend into the body to differing depths.

In some embodiments, removing the first portion of the material at operation 102 and removing the second portion of the material at operation 103 may include intersecting the negative space of the first pattern with the negative space of the second pattern to define at least one aperture (e.g., a through hole) that extends through the body from the first surface to the second surface. In this regard, the depth of the material removed from the first side and the second side may be such that the negative space of the first pattern and the negative space of the second pattern combine to form apertures through the body in some embodiments. Thus, the etchant applied to the first surface and the etchant applied to the second surface may be configured to extend to first and second depths such that the combined depth is at least equal to the thickness of the body. Accordingly, in embodiments in which intersecting is desired, at a minimum the etchants may be configured to extend through the material to a combined depth equal to the thickness of the body. However, in other embodiments, to ensure intersection, the etchants may be configured to extend to a combined depth that is greater than the thickness of the body.

In embodiments in which intersecting is desired, the etchants may be configured to extend to the same depth, or differing depths. For example when the etchants extend to the same depth, each etchant may be configured to extend through about 50% to about 75%, through about 55% to about 65%, or extend through about 55%, of the thickness of the body. By way of further example, when the etchants extend to differing depths, a first etchant may be configured to extend through about 10% to about 50%, though about 20% to about 40%, or through about 35% of the thickness of the body. Conversely, the second etchant may be configured to extend through about 50% to about 90%, though about 60% to about 80%, or through about 70% of the thickness of the body. Further, the combined thickness through which the etchant(s) are configured to extend, regardless of whether the first etchant and the second etchant are configured to extend to the same depth, may be from about 100% to about 130%, from about 100% to about 120%, or about 110%.

In other embodiments, removing the first portion of the material at operation 102 and removing the second portion of the material at operation 104 may be conducted such that the negative space of the first pattern and the negative space of the second pattern do not intersect. In this regard, in one embodiment the combined depth to which the negative space of the first surface and the negative space of the second surface extend may be less than 100% of the thickness of the body. Alternatively, the combined depth to which the negative space of the first surface and the negative space of the second surface extend may exceed 100% of the thickness of the body, but the negative spaces may be offset such that they do not intersect.

Accordingly, a variety of three-dimensional structures may be formed in accordance with embodiments of the methods disclosed herein. As noted above, although the description of the methods for forming the three-dimensional structures disclosed herein are generally described with respect to embodiments in which material is removed from a body, in other embodiments the three-dimensional structures may be formed by adding material. For example, the structures may be formed by molding or casting, in which a mold or cast is employed to form the three-dimensional structure from a fluid substance, such as a liquid metal or plastic. In another embodiment, material defining a body may be compressed to form a desired three-dimensional shape by forging.

Accordingly, methods for forming three-dimensional structures are provided. Means for forming three-dimensional structures are also provided. The means for forming three-dimensional structures may include means for providing a body comprising a material defining a first surface and a second surface; means for removing a first portion of the material from the body to define a first pattern of a positive space and a negative space at the first surface; and means for removing a second portion of the material from the body to define a second pattern of a positive space and a negative space at the second surface. Accordingly, as described above with respect to the method, the first pattern and the second pattern combine to form the three-dimensional structure. In this regard, the means may include any of the above-described structures and assemblies, including lasers, machines, molding equipment, casting equipment, forging equipment, and chemical etching equipment such as masks and etchants.

Further a non-transitory computer readable medium for storing computer instructions executed by a processor in a controller for controlling an etching device. The non-transitory computer readable medium may include computer code for removing a first portion of a material from a body to define a first pattern of a positive space and a negative space at a first surface of the body. Further, the non-transitory computer readable medium may include computer code for removing a second portion of the material from the body to define a second pattern of a positive space and a negative space at a second surface of the body, wherein the first pattern and the second pattern combine to form the three-dimensional structure.

In some embodiments the computer code for removing the first portion of the material and the computer code for removing the second portion of the material includes computer code for intersecting the negative space of the first pattern with the negative space of the second pattern to define at least one aperture that extends through the body from the first surface to the second surface. However, in other embodiments the computer code may be configured to cause the negative spaces to not intersect, as described above. Further, in some embodiments the etching device may include a chemical etching device, and the computer code for removing the first portion of the material and the computer code for removing the second portion of the material includes computer code for applying at least one mask to the first surface and the second surface and computer code for applying at least one etchant to the first surface and the second surface. In alternate embodiments the etching device may include lasers, machinery (e.g., a mill), molding equipment, casting equipment, or forging equipment, and the controller may be a controller configured therefore. Thus, the non-transitory computer readable medium may include computer code for operating these various devices in accordance with the methods disclosed herein.

The three-dimensional structures of the present disclosure may define a variety of shapes and configurations. In this regard, the embodiments disclosed herein are provided for example purposes only, and it should be understood that the structures may define a variety of other configurations within the scope of the disclosure. By way of example, FIGS. 3 and 4 illustrate a three-dimensional structure 200 in accordance with one embodiment of the disclosure. FIG. 3 illustrates a first surface 200A of the three dimensional structure 200, whereas FIG. 4 illustrates an opposing second surface 200B. As illustrated, the pattern defined in the first surface 200A of the three-dimensional structure 200 is identical to the pattern defined in the second surface 200B of the three-dimensional structure. However, as illustrated, the patterns are displaced relative to one another such that negative spaces 202A of the first pattern at the first side 200A align with positive spaces 204B of the second pattern at the second side 200B, and positive spaces 204A of the first pattern at the first side 200A align with negative spaces 202B of the second pattern at the second side 200B. In other embodiments the patterns may be shifted from alignment in other manners, such as via rotation of one pattern relative to the other about an angle. Thus, although apertures 206 extend through the material defining the three-dimensional structure from the first surface 200A to the second surface 200B (due to intersection of the negative space 202A of the first pattern with the negative space 202B of the second pattern), the apertures are relatively smaller in area (individually and cumulatively) than the area of the negative space 202A defined by the first pattern or the negative space 202B defined by the second pattern.

Variations of three-dimensional structures may be formed even when the same patterns are applied to the first and second surfaces. In this regard, for example, in the embodiment of the three-dimensional structure 200 illustrated in FIGS. 3 and 4, the first surface 200A and the second surface 200B are relatively close to one another such that they are directly adjacent. However, as illustrated in FIG. 5, in one embodiment of a three-dimensional structure 300, the first surface 300A and the second surface 300B may be displaced from one another. In this regard, the positive space 304A of the first pattern and/or the positive space 304B of the second pattern may form one or more connecting members 308, which connect the first surface 300A to the second surface 300B to define a three-dimensional box shape. Accordingly, although the patterns employed to form the three-dimensional structure 300 of FIG. 5 are the same as the patterns employed to form the three-dimensional structure of FIG. 4, the three-dimensional structures may differ.

By way of further example, FIGS. 6 and 7 illustrate an additional embodiment of a three-dimensional structure 400 that employs the same patterns as the three-dimensional structure of FIGS. 3 and 4. As illustrated in FIG. 6, the patterns forming the three-dimensional structure 400 may be aligned in the same manner as the patterns forming the three-dimensional structure 200 of FIGS. 3 and 4. However, as illustrated in FIG. 7, the first surface 400A and/or the second surface 400B may be non-planar, in contrast to the planar surfaces 200A, 200B illustrated in FIGS. 3 and 4.

Accordingly, the various embodiments of the three-dimensional structures described herein may be employed in conjunction with planar or non-planar surfaces.

FIGS. 8 and 9 illustrate an alternate embodiment of a three-dimensional structure 500 in which the first pattern at the first surface 500A is different than the second pattern at the second surface 500B. In particular, the first pattern at the first surface 500A is the inverse of the second pattern at the second surface 500B. In this regard, the positive space 504A at the first surface 500A may be substantially equal in size and/or shape to the negative space 502B of the second surface 500B. Further, the negative space 502A of the first surface 500A may be substantially equal in size and/or shape to the positive space 504B of the second surface 502A. In this embodiment, the patterns are positioned such that apertures 506 are defined through three-dimensional structure 500 by the negative spaces 502A, 502B of the first and second patterns.

Additionally, a projected area of the negative space 502A defined by the first pattern is less than a projected area of the negative space 502B defined by the second pattern. Conversely, a projected area of the positive space 504B defined by the first pattern is greater than a projected area of the positive space 504B defined by the second pattern. However, in other embodiments the projected areas of the first surface and the second surface may be equal, or the second surface may include a negative space that defines a projected area that is less than that of the first surface and the second surface may include a positive space that defines a projected area that is greater than that of the first surface.

FIGS. 10 and 11 illustrate an additional embodiment of a three-dimensional structure 600. As illustrated, the first surface 600A differs from the second surface 600B in that part of the first surface defines a convex configuration, whereas part of the second surface defines a convex configuration. The three-dimensional structure 600 includes the same pattern applied to both the first surface 600A and the second surface 600B. In this regard, the three-dimensional structure 600 of FIGS. 10 and 11 demonstrates that the same pattern may be applied to the first and second surfaces even when the first and second surfaces define differing surface configurations (e.g., planar versus non-planar, convex versus concave, etc.).

The first pattern and the second pattern are offset such that the positive spaces 604A at the first surface 600A align with the negative spaces 602B at the second surface 600B and the negative spaces 602A at the first surface align with the positive spaces 604B at the second surface. This configuration defines apertures 606 therethrough. Further, the pattern employed to form the three-dimensional structure 600 of FIGS. 10 and 11 is substantially the inverse of the pattern employed to form the three-dimensional structure 200 of FIGS. 3 and 4.

Note that since the same pattern is employed at both the first surface 600A and the second surface 600B, the projected area of the negative space 602A defined by the first pattern is substantially equal to a projected area of the negative space 602B defined by the second pattern. Further, a projected area of the positive space 604B defined by the first pattern is substantially equal to a projected area of the positive space 604B defined by the second pattern (e.g., perpendicular to the second surface 600B). There may be slight variations in the projected areas defined by the first surface 600A and the second surface 600B due to the offset between the first pattern and the second pattern cutting off the patterns at the edges thereof at differing points.

FIGS. 12 and 13 illustrate an additional embodiment of a three-dimensional structure 700. As illustrated, the three-dimensional structure may define more complex shapes than the three-dimensional shapes previously described. In this regard, the positive space 704A at the first surface 700A may cooperate with the negative space 702B at the second surface 700B to define curved, "sail-shaped," structures. In this regard, for example, a body defining one or more planar surfaces may be machined, etched, or otherwise processed to define a variety of curved or angular surfaces. In other embodiments, the body may initially define a non-planar configuration with the processing operations (e.g., removal of material from the first surface at operation 102 or removal of material from the second surface at operation 104) thus involving removal of material from the non-planar body to define complex shapes. As also described herein, injection molding, casting, forging, or other processes by which material is combined or shaped may be employed to form the three-dimensional structure.

FIG. 14 illustrates another embodiment of a three-dimensional structure 800. This three-dimensional structure 800 illustrates that the patterns applied to the surfaces need not extend all the way to the peripheral edges 810 of the three dimensional structured. In this regard, the peripheral edges 810 of the three-dimensional structure 800 may retain the initial configuration of the body to which the patterns are applied in some embodiments. In other embodiments the patterns may be applied to relatively smaller portions of the first surface and/or the second surface, depending on the desired resulting three-dimensional structure.

FIG. 15 illustrates an embodiment of a three-dimensional structure 900 in which the negative space 902A at the first surface 900A and the negative space 902B at the second surface 900B is greater than the positive space 904A at the first surface and the positive space 904B at the second surface. In this regard, the patterns employed herein may be configured as desired to produce three-dimensional structures having relatively large portions of material, or relatively small portions of material.

By way of further example, FIG. 16 illustrates an embodiment of a three dimensional structure 1000 in which the negative space is relatively less than the positive space. Further, the three-dimensional structure 1000 illustrates that the patterns may vary across the surfaces. For example, in the illustrated embodiment the spacing of each of the negative spaces 1002A is the same across the first surface 1000A, but the dimensions of each of the negative spaces decreases at the center of the first surface and increases toward the peripheral edges 1010 of the first surface. Thus, the apertures 1006 through the three-dimensional structure vary in size (e.g., area) across the surface of the structure, with the center of the three-dimensional structure 1000 defining smaller apertures therethrough. The size of the positive and negative spaces may vary in other manners in other embodiments.

Embodiments in which the size of the negative space varies across the surfaces of the three-dimensional structure may be configured for use in embodiments in which varying optical, thermal, or acoustical properties are desirable. For example, larger apertures (defined by the negative spaces) may be employed at positions where greater heat transfer (and/or optical or acoustical transmission) is desirable, and the smaller spaces may be configured to correspond with areas in which less heat transfer (and/or optical or acoustical transmission) is desirable. Accordingly, the patterns may be configured to provide varying characteristics depending on the application thereof.

Note further that FIG. 16 illustrates an embodiment in which the second pattern at the second surface (not illustrated) is identical to the first pattern and aligned therewith. Accordingly, the apertures 1006 defined through the three-dimensional structure 1000 correspond in size and position to the negative space 1002A of the first surface 1000A and in size and position to the negative space of the second surface (not shown).

FIG. 17 illustrates an embodiment in which the three-dimensional structure 1100 is formed from multiple layers of material. In embodiments in which the three-dimensional structure 1100 is formed by removal of material, the layers may be attached prior to removal of the material, or the layers may be attached after removal of material. In the illustrated embodiment, the three-dimensional structure 1100 includes three layers 1112, 1114, 1116. The first layer 1112 may define the first surface 1100A, the third layer 1116 may define the second surface (not shown), and an intermediate layer 1114 may be positioned between the first layer 1112 and the third layer 1116. In the illustrated embodiment the intermediate layer 1114 corresponds in size and shape to an aggregate pattern of the first pattern and the second pattern employed to form the three-dimensional structure 1100. In this regard, the intermediate layer 1114 defines positive space where one or both of the first pattern and the second pattern defines positive space, and the intermediate layer defines negative space where both the first pattern and the second pattern define negative space. However, various other configurations may be employed in other embodiments.

FIG. 18 illustrates an additional embodiment of a three-dimensional structure 1200. The three-dimensional structure 1200 includes first and second patterns of positive negative spaces in forms that overlap relative to one another such that the apertures 1206 extend through three-dimensional structure at varying angles. In this regard, the view through the three-dimensional structure at any given angle is restricted to views through the apertures 1206 that align with the perspective of the user.

The three-dimensional structures described herein as well as the methods for forming the three-dimensional structures may be employed in a variety of applications. In this regard, FIG. 19 illustrates one example embodiment in which the body of the three-dimensional structure defines a housing 1300 for a portable electronic device. In this regard, the first surface 1300A of the three-dimensional structure may define an outer surface of the housing 1300, and the second surface (not shown) may define an inner surface of the three dimensional structure. Further, in some embodiments the positive space 1304A of the first pattern and the positive space 1304B of the second pattern may define a speaker cover, as illustrated. In this regard, the negative space 1302B of the second pattern may be configured to define relatively small apertures 1306 through the housing 1300 which allow sound to travel therethrough, but which are configured to prevent dust and other debris from traveling therethrough to protect the internal components of the portable electronic device. Thus, for example, the three-dimensional structures disclosed herein may provide multiple functions in a single-piece structure. In contrasts, other methods of forming structures with similar characteristics may involve attaching two separate structures (e.g. a housing and a screen), which may involve additional complexity and costs.

As noted above, in some embodiments the first pattern of positive and negative space and the second pattern of positive and negative space may be configured such that the negative space of the first pattern intersects the negative space of the second pattern to define apertures through the three-dimensional structure. In this regard, FIGS. 20-24 illustrate example configurations of apertures that may result from the intersection of negative spaces. For example, FIG. 20 illustrates a partial cross-sectional view through a three-dimensional structure 1400 defining an aperture 1406 therethrough.

As illustrated, the aperture 1406 may be configured such that it is substantially uniform in width in some embodiments. Thus, although a first portion of the aperture 1406 may be defined by the negative space 1402A of the first pattern and a second portion of the aperture may be formed by the negative space of the second pattern, these portions may be indistinguishable due to the two portions defining the same width and extending along the same axis 1418. Further, the aperture 1406 may be configured to extend substantially perpendicular to the first surface 1400A and/or the second surface 1400B. As further illustrated, a linear path may be defined through the three-dimensional structure 1400 along the axis 1418 of the aperture 1406.

Apertures that define linear paths therethrough may be employed in applications of the three-dimensional structures in which it is desirable to allow a view therethrough. In this regard, by providing a linear path 1406 through the three-dimensional structure 1400, a user may be able to see through the three-dimensional structure at each aperture 1406. In the embodiment illustrated in FIG. 20, the aperture 1406 defines linear paths therethrough, including one linear path along the axis 1418 that is perpendicular to the first surface 1400A and the second surface 1400B.

FIG. 21 illustrates a partial cross-section through an additional embodiment of a three-dimensional structure 1500. As was the case in the previously discussed embodiment of a three-dimensional structure 1400, the three-dimensional structure 1500 of FIG. 21 also defines a linear path through an aperture 1506 along an axis 1518 that extends perpendicularly to the first surface 1500A and the second surface 1500B. However, the aperture 1506 of the three-dimensional structure 1500 of FIG. 21 includes a first portion 1506A and a second portion 1506B that define differing dimensions. In this regard, the negative space 1502A of the first pattern may be relatively larger than the negative space 1502B of the second pattern. For example, the housing 1300 in FIG. 19 shows an embodiment in which the negative spaces 1302A of the first pattern are larger in area than the negative spaces 1302B of the second pattern. In this regard, as described above, the first pattern at the outer surface may be configured to provide a desirable aesthetic configuration and/or provide a configuration that is easy for a user to grip or defines other desirable properties, whereas the second pattern may define relatively smaller negative spaces that block dust from traveling into the portable electronic device.

FIG. 22 illustrates a cross-sectional view through an additional embodiment of a three-dimensional structure 1600 in which a linear path is defined through the body along an axis 1618. However, unlike the embodiments of the three-dimensional structures 1400, 1500 illustrated in FIGS. 20 and 21, the axis 1618 of the aperture 1606 through the three-dimensional structure 1600 of FIG. 22 is not perpendicular to the first surface 1600A or the second surface 1600B. In this regard, in some embodiments the aperture through the three-dimensional structure may extend along an axis defining an angle with respect to one or both of the first surface and the second surface. Accordingly, although a linear path is defined through the three-dimensional structure 1600, when viewed from a perspective perpendicular to one of the surfaces 1600A, 1600B, it may not be possible to see through the three-dimensional structure. This embodiment of apertures may be preferable when it is desirable to prevent a user from seeing through the three-dimensional structure except from an angle substantially corresponding to the angle of the axis upon which the aperture extends.

In some embodiments the three-dimensional structure 1600 may be employed as part of a system that further includes a component 1620. The component 1620 may be, for example, a fan configured to direct air through the aperture 1606 or a speaker configured to direct sound through the aperture. As further illustrated in FIG. 22, in some embodiments the component 1620 may be configured to output emissions 1622 (e.g., sound or airflow) in a direction that is substantially parallel to the axis 1618 of the aperture 1606. In this regard, the angle of the axis 1618 of the aperture 1606 may be employed to conceal the component 1620 from view at a normal angle relative to one or both of the surfaces 1600A, 1600B while still allowing for acoustical or thermal transfer therethrough.

FIG. 23 illustrates a partial cross-sectional view through an additional embodiment of a three-dimensional structure 1700. As illustrated, in some embodiments a first portion 1706A and a second portion 1706B of an aperture 1706 defined through the three-dimensional structure 1700 may extend along non-parallel axes 1718A, 1718B. Accordingly, as illustrated, in some embodiments a linear path may not be defined through the three-dimensional structure. Instead, a non-linear path (e.g., along the first axis 1718A and the second axis 1718B) may be defined through the three-dimensional structure 1700.

In this regard, the embodiment of the three-dimensional structure 1700 illustrated in FIG. 22 may include apertures 1706 that may, for example, allow for the transmission of heat sound, or airflow therethrough. However, since no linear path is defined therethrough, transmission of light through the aperture 1706 may be prevented or reduced depending on the properties of the material defining the three-dimensional body (e.g., depending on the reflectivity of the material). Accordingly, this embodiment may be employed when it is undesirable to allow a user to see through the aperture 1706 regardless of the angle at which the user is viewing the aperture. However, airflow may still occur through the aperture 1706 and/or sound may transmit therethrough.

As illustrated in FIG. 24, in another embodiment of a three-dimensional structure 1800 that includes apertures 1806 therethrough having first 1806A and second 1806B portions that extend along first 1718A and second 1718B axes that are not parallel, a linear path may still be defined therethrough. In this regard, as illustrated, a linear path may extend along an axis 1818 that is perpendicular to one or both of the first 1800A and second 1800B surfaces.

Similarly, although the embodiment of the three-dimensional structure 1600 illustrated in FIG. 22 does not include a linear path therethrough that is perpendicular to the first surface 1600A or the second surface 1600B, in other embodiments this may not be the case. For example, if the width of the aperture 1606 is sufficiently large, a linear path may be defined therethrough. For example, the aperture may be configured in accordance with either the first portion 1806A or the second portion 1806B of the aperture 1806 illustrated in FIG. 24, which each define a linear path therethrough perpendicular to the first 1800A and second 1800B surfaces.

Accordingly, the apertures may be specifically tailored to define a linear path or a non-linear path therethrough. The linear path may be perpendicular to one or both of the first and second surfaces, or at an angle to one or both of the first and second surfaces. Thus, the methods and three-dimensional structures may define a variety of configurations according the embodiments disclosed herein.

Further, the three-dimensional structures disclosed herein may be employed for a variety of purposes. For example, as noted above, the thee-dimensional structures may be employed as housings for electronic devices. In other embodiments the three-dimensional structures may define heat sinks. In this regard, the three-dimensional structures disclosure herein may be configured to define large surface areas, which may efficiently radiate heat. Further, in other embodiments the three-dimensional structures may be configured as springs, and the stiffness thereof may be configured as desired. In this regard, depending on the material employed, the negative spaces of the patterns may provide the three-dimensional structures with the ability to stretch and/or compress under load.

Further, the particular properties of the three-dimensional structures may be adjusted. For example, surface area, size and position of apertures (if any), etc. may be adjusted to form the desired three-dimensional structure. In some embodiments the negative spaces of the patterns may be employed to create relatively lightweight structures. Further, the patterns employed in the three-dimensional structures may be configured to create aesthetically pleasing structures. Accordingly, the properties of the three-dimensional structures disclosed herein may be adjusted to suit the particular application for which the structures are intended.

Many modifications and other embodiments of the disclosure set forth herein will come to mind to one skilled in the art to which the disclosure pertains having the benefit of the teachings presented in the foregoing descriptions. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A three-dimensional structure, comprising:
    a body having a first surface and a second surface, the first surface defining a first pattern of negative spaces that extend into and are further defined by the body, and the second surface defining a second pattern of negative spaces that extend into and are further defined by the body; and
    the body further defining a combined negative space including each negative space of the first pattern of negative spaces in communication with each negative space of the second pattern of negative spaces.

2. The three-dimensional structure of claim 1, wherein:
    the first surface and the second surface are located at different positions on the body; and
    the first surface opposes the second surface.

3. The three-dimensional structure of claim 1, wherein the body obstructs a line of sight through the combined negative space.

4. The three-dimensional structure of claim 1, wherein the three-dimensional structure forms a part of a housing for an electronic device.

5. The three-dimensional structure of claim 1, wherein the body comprises a metal.

6. The three-dimensional structure of claim 1, wherein the first pattern of negative spaces on the first surface has a same spatial arrangement as the second pattern of negative spaces on the second surface.

7. The three-dimensional structure of claim 1, wherein the first pattern is offset from the second pattern.

8. The three-dimensional structure of claim 1, wherein the first pattern and the second pattern are regular and repeating patterns.

9. The three-dimensional structure of claim 1, wherein the negative spaces of the first pattern have substantially a same shape and size as the negative spaces of the second pattern.

10. A housing for an electronic device, comprising:
    a body including a first surface defining a first pattern of openings, and a second surface defining a second pattern of openings;
    the body defining:
        a first pattern of negative spaces in communication with the first pattern of openings, extending into the body along a first axis; and
        a second pattern of negative spaces in communication with the second pattern of openings, extending into the body along a second axis; and
    wherein the first and second axes are offset and the negative spaces of the first pattern of negative spaces intersect with the negative spaces of the second pattern of negative spaces to form a plurality of apertures defined by the body.

11. The housing of claim 10, wherein the first surface opposes the second surface.

12. The housing of claim 10, wherein the body comprises a metal.

13. The housing of claim 10, wherein the first pattern of openings is the same as the second pattern of openings.

14. The housing of claim 10, wherein the first pattern of openings and the second pattern of openings are regular and repeating patterns.

15. The housing of claim 10, wherein the body further defines an internal negative space area including each negative space of the first pattern of negative spaces being in communication with each negative space of the second pattern of negative spaces.

16. The housing of claim 10, wherein the first pattern of negative spaces and the second pattern of negative spaces are regular and repeating patterns.

17. The housing of claim 16, wherein the negative spaces of the first pattern have substantially a same shape and size as the negative spaces of the second pattern.

18. A three-dimensional structure, comprising:
    a body including a first surface and a second surface, the second surface being at a different position on the body than the first surface;
    the body defining a combined negative space forming a first pattern of openings on the first surface and a second pattern of openings on the second surface, the first pattern of openings being offset relative to the second pattern of openings.

19. The three-dimensional structure of claim 18, wherein the first pattern of openings on the first surface has a same spatial arrangement as the second pattern of openings on the second surface.

20. The three-dimensional structure of claim 18, wherein the first pattern of openings and the second pattern of openings are regular and repeating patterns.

* * * * *